(12) United States Patent
Skepnek et al.

(10) Patent No.: US 10,367,286 B2
(45) Date of Patent: *Jul. 30, 2019

(54) TRANSCEIVER MODULE WITH FLEX CIRCUIT

(71) Applicant: Methode Electronics, Inc., Chicago, IL (US)

(72) Inventors: Robert Skepnek, Chicago, IL (US); Joseph Llorens, Winfield, IL (US); Alexandros Pirillis, Chicago, IL (US)

(73) Assignee: Methode Electronics, Inc., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/859,906

(22) Filed: Jan. 2, 2018

(65) Prior Publication Data
US 2018/0205166 A1   Jul. 19, 2018

Related U.S. Application Data

(63) Continuation of application No. 15/406,920, filed on Jan. 16, 2017, now Pat. No. 9,972,930.

(51) Int. Cl.
| | | |
|---|---|---|
| *H01R 12/81* | (2011.01) | |
| *H01R 12/77* | (2011.01) | |
| *H01R 12/82* | (2011.01) | |
| *G06F 1/16* | (2006.01) | |
| *H01R 12/62* | (2011.01) | |
| *H01R 35/02* | (2006.01) | |
| *H05K 1/02* | (2006.01) | |
| *H05K 1/14* | (2006.01) | |
| *G02B 6/42* | (2006.01) | |

(52) U.S. Cl.
CPC .......... *H01R 12/81* (2013.01); *G06F 1/1632* (2013.01); *H01R 12/62* (2013.01); *H01R 12/772* (2013.01); *H01R 12/82* (2013.01); *H01R 35/02* (2013.01); *H05K 1/028* (2013.01); *H05K 1/147* (2013.01); *G02B 6/4281* (2013.01); *H05K 2201/046* (2013.01); *H05K 2201/2018* (2013.01)

(58) Field of Classification Search
CPC ...... H01R 12/81; H01R 12/772; H01R 12/82; H01R 35/02
USPC .......................................................... 439/1
See application file for complete search history.

(56) References Cited

U.S. PATENT DOCUMENTS

| | | | | |
|---|---|---|---|---|
| 4,226,491 A | * | 10/1980 | Kazama | H05K 1/02 361/759 |
| 5,507,654 A | * | 4/1996 | Daly | H01R 12/57 439/76.1 |
| 5,636,998 A | * | 6/1997 | Daly | H01R 13/6658 439/498 |
| 6,179,627 B1 | * | 1/2001 | Daly | H01R 13/6658 439/354 |
| 6,315,207 B1 | * | 11/2001 | Eisele | G06F 3/0607 235/481 |

(Continued)

*Primary Examiner* — Alexander Gilman
(74) *Attorney, Agent, or Firm* — Gould & Ratner LLP

(57) ABSTRACT

A pluggable module comprising a housing having a first end and second end, an edge connector disposed at the first end, an F-type coaxial connector at the second end and a release lever including a stamped body that is symmetrical about a centerline bisecting the length of the body. The pluggable module comprises a miniature balun disposed within the module for converting between a single-ended input to a differential load.

26 Claims, 13 Drawing Sheets

(56) References Cited

U.S. PATENT DOCUMENTS

| | | | | |
|---|---|---|---|---|
| 6,713,510 B2* | 3/2004 | Ekwuribe | ............ | A61K 31/085 514/532 |
| 6,930,240 B1* | 8/2005 | Giboney | ................ | H05K 3/361 174/393 |
| 7,215,889 B2* | 5/2007 | Light | .................... | G02B 6/4292 398/135 |
| 7,513,698 B2* | 4/2009 | Andersson | ............ | G02B 6/4292 385/88 |
| 7,555,572 B2* | 6/2009 | Fischer | .................. | H01R 25/00 710/10 |
| 7,614,913 B2* | 11/2009 | Ice | ........................ | H01R 13/648 439/607.05 |
| 7,824,113 B2* | 11/2010 | Wong | ...................... | G02B 6/387 385/53 |
| 9,048,573 B2* | 6/2015 | Grzegorzewska | ... | H01R 13/508 |
| 9,972,930 B1* | 5/2018 | Skepnek | .............. | H01R 12/772 |
| 2006/0025018 A1* | 2/2006 | Dube | ..................... | H01R 23/68 439/628 |
| 2007/0218712 A1* | 9/2007 | Guja | ................... | G02B 6/4201 439/67 |
| 2008/0084834 A1* | 4/2008 | Stanek | .................. | G06F 13/385 370/284 |
| 2013/0004131 A1* | 1/2013 | Skepnek | .............. | G02B 6/4201 385/92 |

* cited by examiner

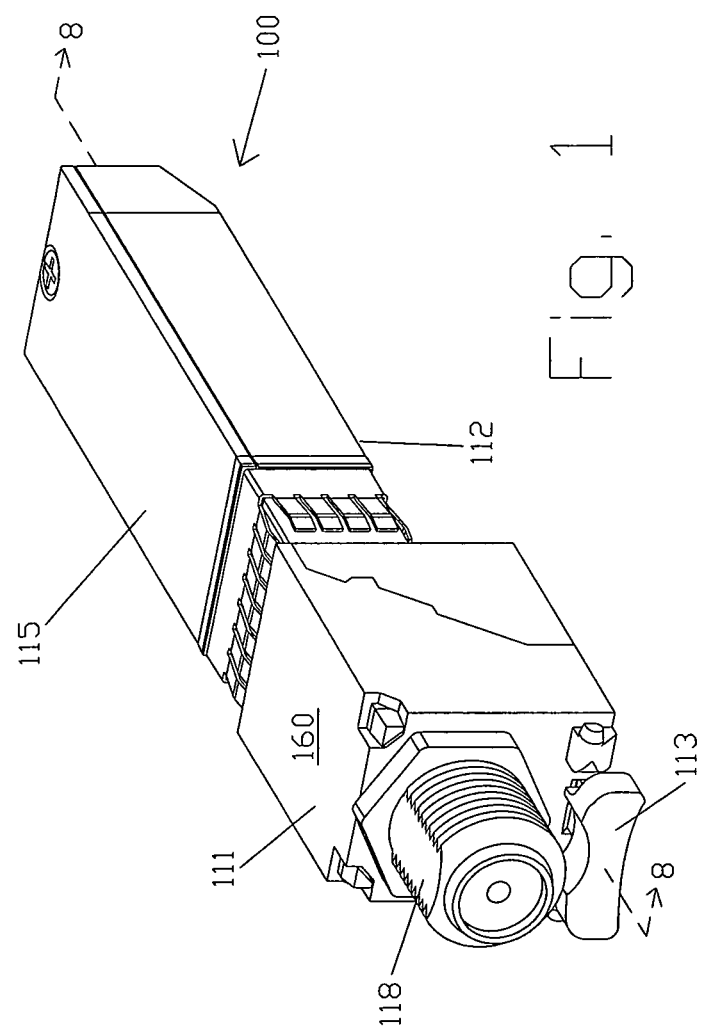

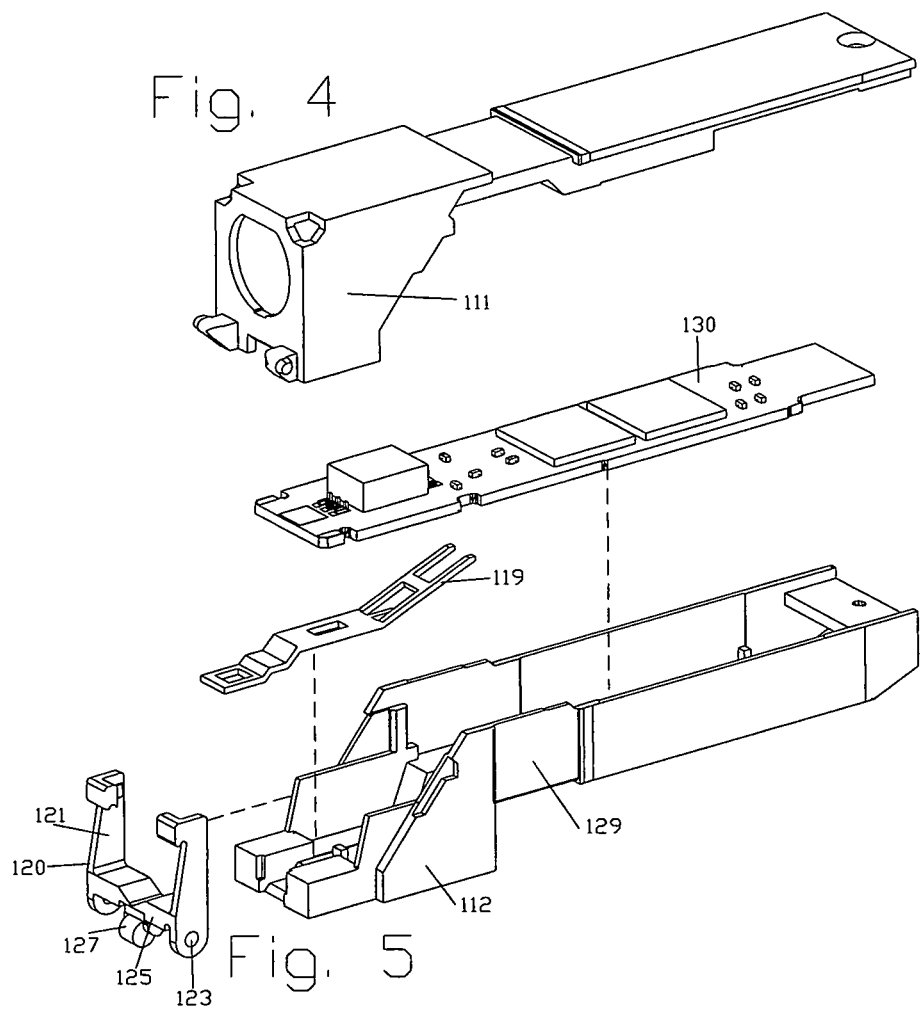

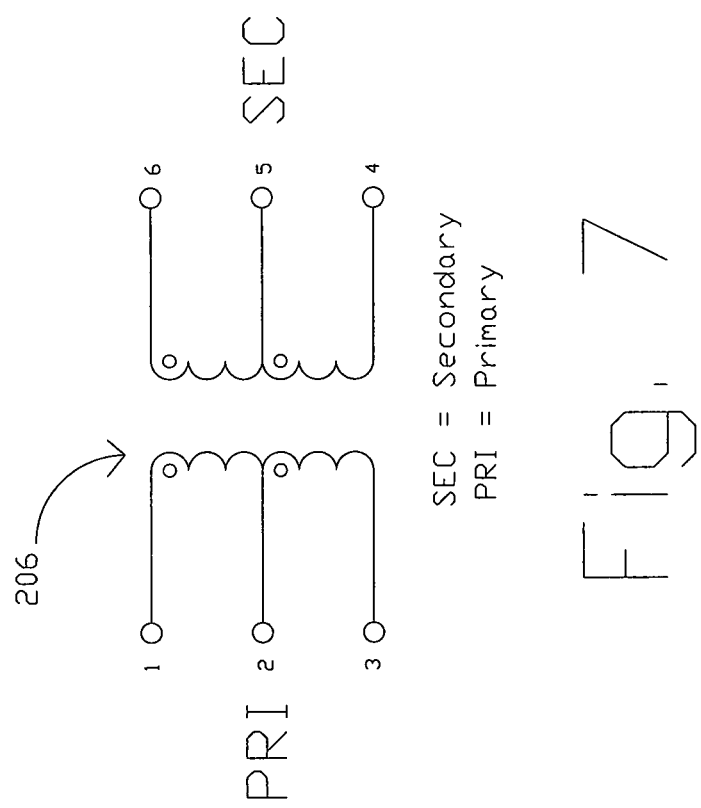

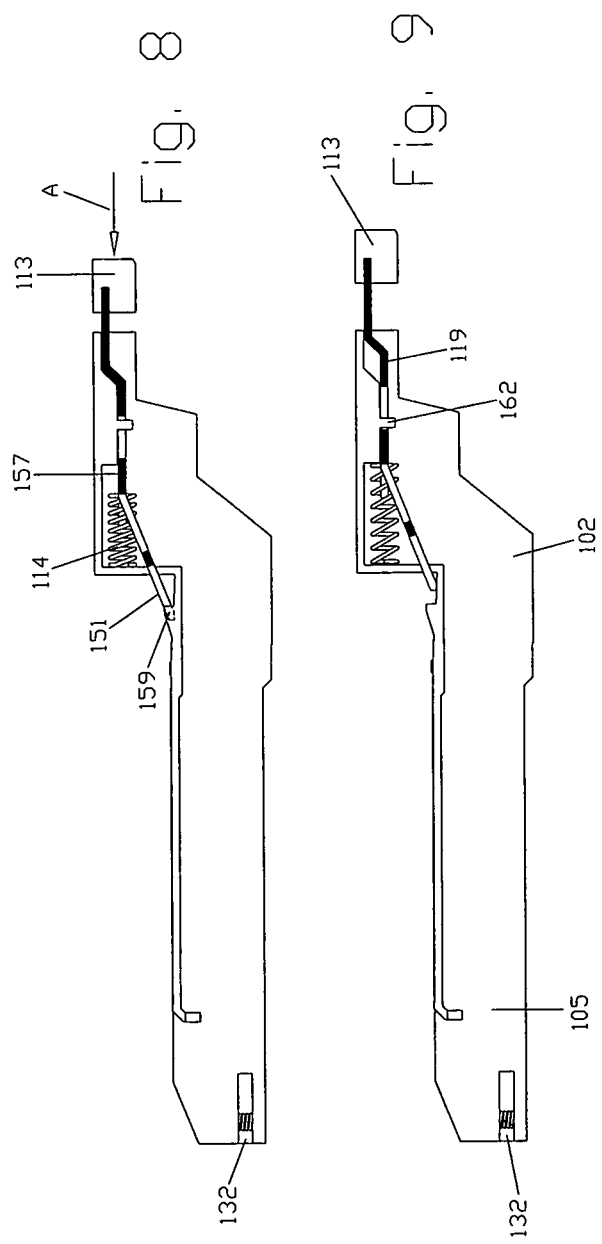

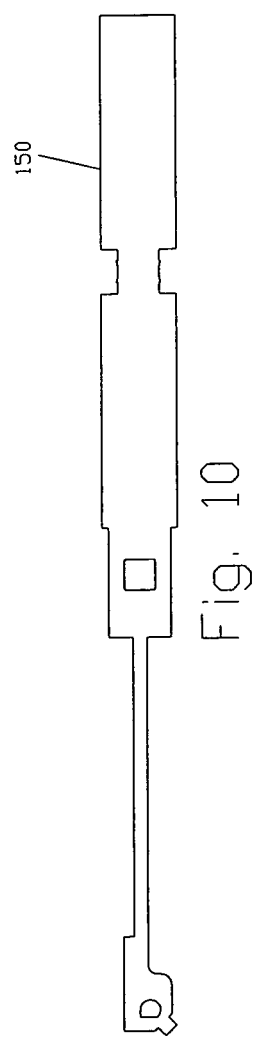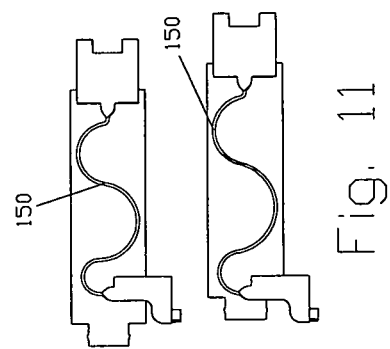

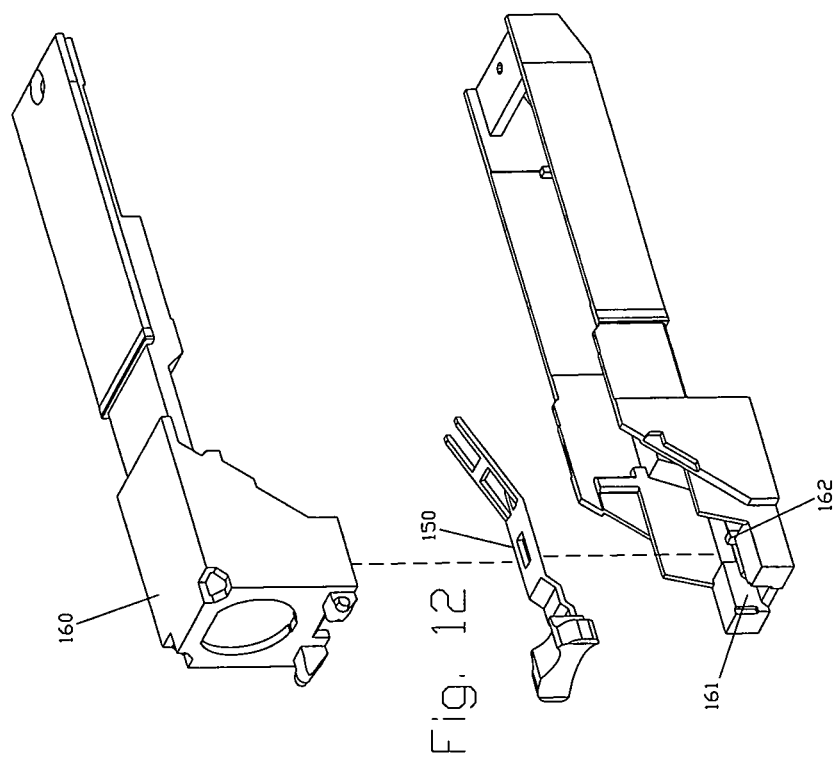

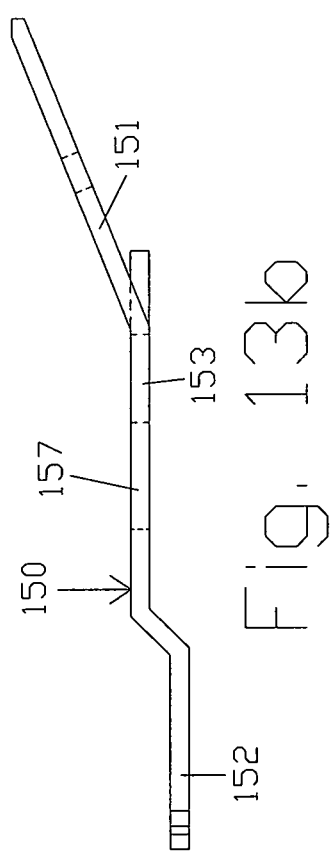

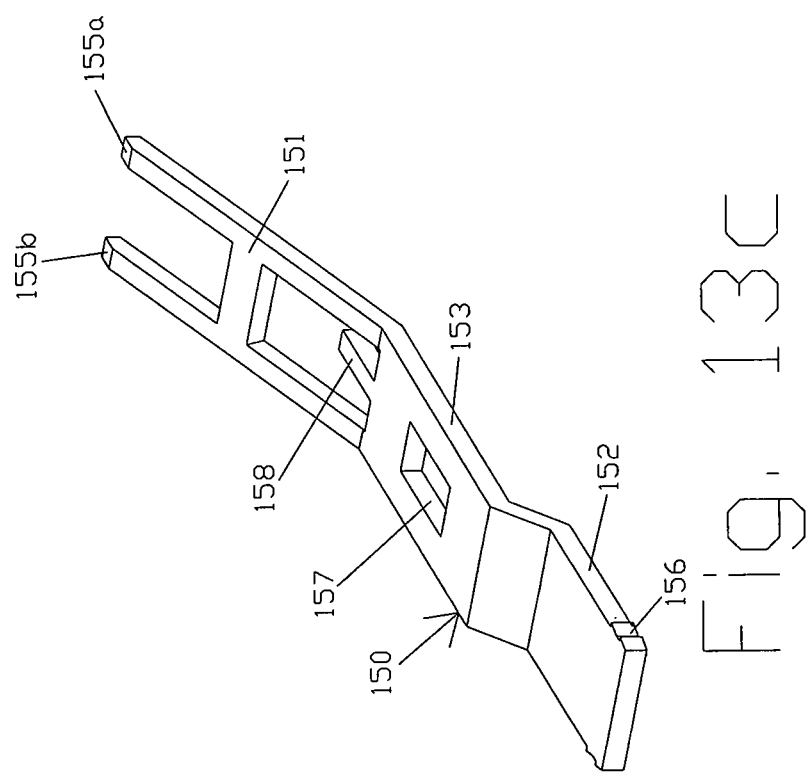

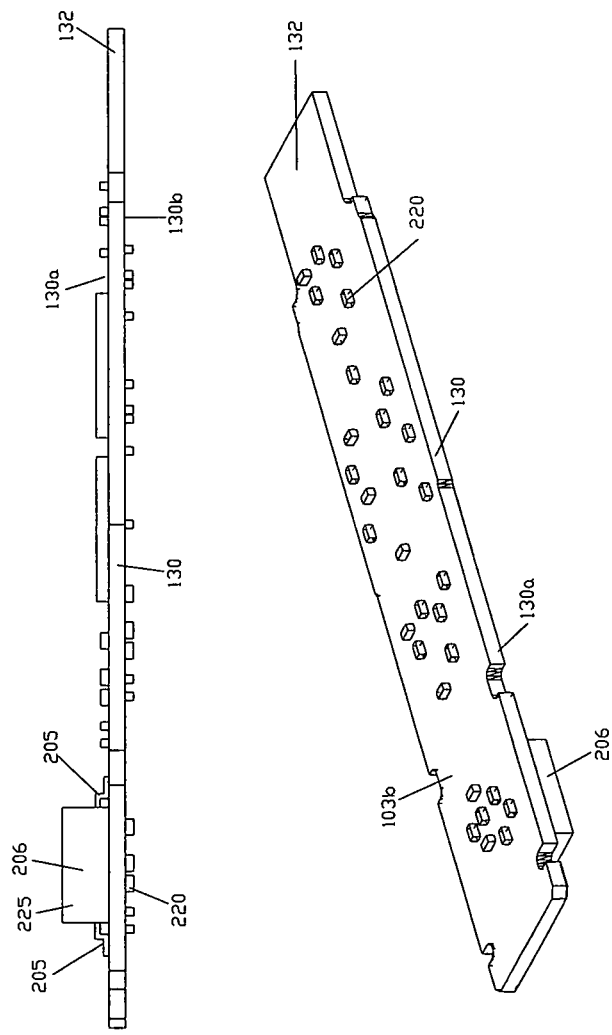

TRANSCEIVER MODULE WITH FLEX CIRCUIT

The present invention claims priority to Provisional application No. 62/385,765 filed Sep. 9, 2016, which is incorporated herein by reference.

The present application pertains to the field of high speed communications and in particular, a pluggable module having a coaxial connector interface.

BACKGROUND

Telecommunications service providers, or carriers, today are focused on the delivery of broadband and ultra-broadband Internet services (or broadband) consisting of video, data and voice; not just telephony as their main source of revenue. The term broadband refers to wide bandwidth data transmission with the ability to simultaneously transport multiple signals and traffic types, sometimes referred to as converged data, over various media types. In the context of Internet access, broadband is used to mean any high-speed Internet access that is always available, in other words always on, and faster than traditional dial-up access. Broadband services can be delivered by one of four means: Digital Subscriber Line (DSL), Cable, Optical Fiber and Satellite.

Telecommunications carriers prefer to deliver their broadband services using DSL because it re-uses the twisted pair phone lines already running out to every residence and business. They are exploring the use of fiber because of its superior bandwidth and speed but the cost to run fiber to the residence or business in anything other than a so called 'green field', new construction situation remains prohibitively high. DSL has evolved gradually over the last 20-years since being first deployed but has consistently been outpaced in terms of bandwidth and speed by broadband services delivered over cable. Today, however, new technologies, including Gfast and G/now/G.hn, are emerging that are able to deliver gigabit broadband services over telephony twisted pair thus giving telecommunications carriers a solution that is competitive with cable and even optical fiber. These new ultra-fast broadband technologies are emerging at a time when the need to minimize capital expense and increase revenue from existing copper assets is at an all time high for the telecommunications carriers. This pressure has forced some carriers to take on the cable assets of otherwise failing satellite services companies in an attempt to profitably monetize them. Now with a mix of both twisted pair and coaxial copper assets, some telecommunications carriers are in need of a convenient means for adapting between the different cable types for broadband delivery to the premises or business.

The invention proposed here address that need and solves the problem by integrating the media interface into a pluggable module suitable for any customer premise equipment (CPE) provisioned with a corresponding socket and cage. Pluggable modules that can be fitted to a CPE for broadband technologies, including Gfast, with a twisted pair electrical connector interface exist. What's missing is a complementing pluggable module with a connector interface suitable for connecting to the coaxial cable assets now owned by some telecommunications carriers.

SUMMARY

The invention integrates an F-Type connector into a pluggable transceiver module, including but not limited to a Small Form Factor Pluggable (SFP) module, to allow for native connectivity to 75Ω coaxial cable infrastructure. Additionally the invention integrates a balun (balancer/unbalance converter) inside the pluggable module to perform the 75Ω single-ended to 100Ω differential conversion necessary between the coax input and subsequent signal processing circuitry. In so doing the invention eliminates the need for an external balun when connecting coaxial cable to equipment ordinarily intended for a twisted pair, balanced connection.

Prior to this invention, in order to connect between coaxial cable and telephony twisted pair it was necessary to use an external balun such as the Gfast balun available from Comtest Networks. Such an external Balun adds incremental cost and complexity when interfacing between coaxial cable and equipment with a twisted pair interface. Additionally the use of an external balun is not an elegant solution because just a standard balun is as big, or indeed bigger, than a pluggable module, such as an SFP.

The invention eliminates the need for an external, oftentimes relatively bulky and expensive standard external Balun when interfacing between coaxial cabling and a telephony twisted pair interface. The invention is compact and by virtue of being integrated into a pluggable module, delivers better signal integrity and overall improved broadband performance. In order to accomplish the invention it was necessary to define, implement and test a miniature Balun of sufficient performance and miniature size that it could be integrated into the pluggable module. Likewise with the F-Type connector it was necessary to develop a host of proprietary hardware for integrating it with the housing of the pluggable module. Furthermore the invention is novel because in addition to the F-Type coaxial interface and an integrated Balun, the pluggable module also incorporates all the electronics necessary for a complete Gfast physical layer interface. As a pluggable module, the invention allows original equipment manufacturers (OEMs) to provision their solutions with a single receptacle port compatible with the invented pluggable module such that adapting between different media types is as straightforward as swapping the pluggable module for one with the needed media interface.

The present invention includes a pluggable module compliant with a Small Form Factor Pluggable (SFP) specification, wherein the balun omits at least one of the following elements: a) thru-hole leads; b) over-molding; and c) ferrite core of low magnetic permeability.

Also the balun may provide at least one of the following elements: a) surface mount leads; b) ferrite core of high magnetic permeability; c) an overall height of the balun package being restricted for use within the envelope dimensions provided by SFP specification.

The invention provides for a miniaturized SFP package by providing a printed circuit board (PCB) having components on both sides of the PCB and the balun having surface mount leads for mounting to pads on a first side of the PCB and facilitating mounting of other components on a second side of the PCB. The invention may comprise a release lever including a stamped body that is symmetrical about a centerline bisecting the length of the body. The invention wherein the release lever body is stamped from a flat metallic sheet. Also the body may include three segments, the first segment forming a generally "H" shaped release member, an opposite second segment having side serrations for receiving a button thereon and a third segment disposed between the first and second segments, the third segment having an opening and a tab extending into a bottom portion of the "H" shaped member.

The invention may comprise a module having an enlarged end having a lever mating area including a finger disposed within the opening; a resilient member for receiving the tab thereon and a pair of legs of the "H" shaped portion for sliding and engaging a release tab. wherein the housing is cast from aluminum, aluminum alloy, zinc or zinc alloy. The invention may further comprise a Gfast wireline physical layer, G.Now/G.hn wireline physical layer or VDSL/VDSL2 wireline physical layer.

A further embodiment of the invention provides a pluggable module comprising a housing having a first end and second end, an edge connector disposed at the first end, an F-type coaxial connector at the second end and a release lever including a stamped body that is symmetrical about a centerline bisecting the length of the body wherein the body is stamped from a flat metallic sheet. Also the body may include three segments, the first segment forming a general "H" shaped release member, an opposite second segment having side serrations for receiving a button thereon and a third segment disposed between the first and second segments, the third segment having an opening and a tab extending into a bottom portion of the "H" shaped position.

The invention further comprises a module having an enlarged end having a lever mating area including a finger disposed within the opening, a resilient member for receiving the tab thereon and a pair of legs of the "H" shaped portion for sliding and engaging a release tab. The invention may further comprise a miniature balun disposed within the module for converting between a single-ended input to a differential load.

A further embodiment of the invention provides for a method of assembling a pluggable module comprising the steps of obtaining a balun having a ferrite core having high magnetic permeability, mounting the balun to a first side of a printed circuit board (PCB) via a surface mount process, mounting other components to a second side of the PCB, casting a housing from aluminum, aluminum alloy, zinc or zinc alloy stamping a release lever from a flat sheet of metal, and forming the release lever by bending the flat metal to form a first, second and third segment of the release lever.

Also the body of the release lever may be formed to provide, the first segment forming a generally "H" shaped release member, an opposite second segment having side serrations for receiving a button thereon and the third segment disposed between the first and second segments, the third segment having an opening capable of receiving a tab extending into a bottom portion of the "H" shaped member.

BRIEF DESCRIPTION OF THE DRAWINGS

FIG. 11 is a bottom view of the forming process of the release lever sheet of the present invention;

DETAILED DESCRIPTION

Embodiments of the Coaxial Module invention are depicted in FIGS. 1-15. In particular, a module having an edge connector at the first end that is compliant with SFP standard SFF-8431 SFP+ specification. The module may have connectors, latching mechanisms and other components, as disclosed in U.S. Pat. Nos. 7,181,173; 8,040,687 and 8,335,088 that are incorporated herein by reference. The second end of the module includes an F-Type coaxial connector as shown in FIGS. 1-5. Such a module is pluggable into a receptacle of a host device, for example, Customer Premise Equipment.

Figure 1:
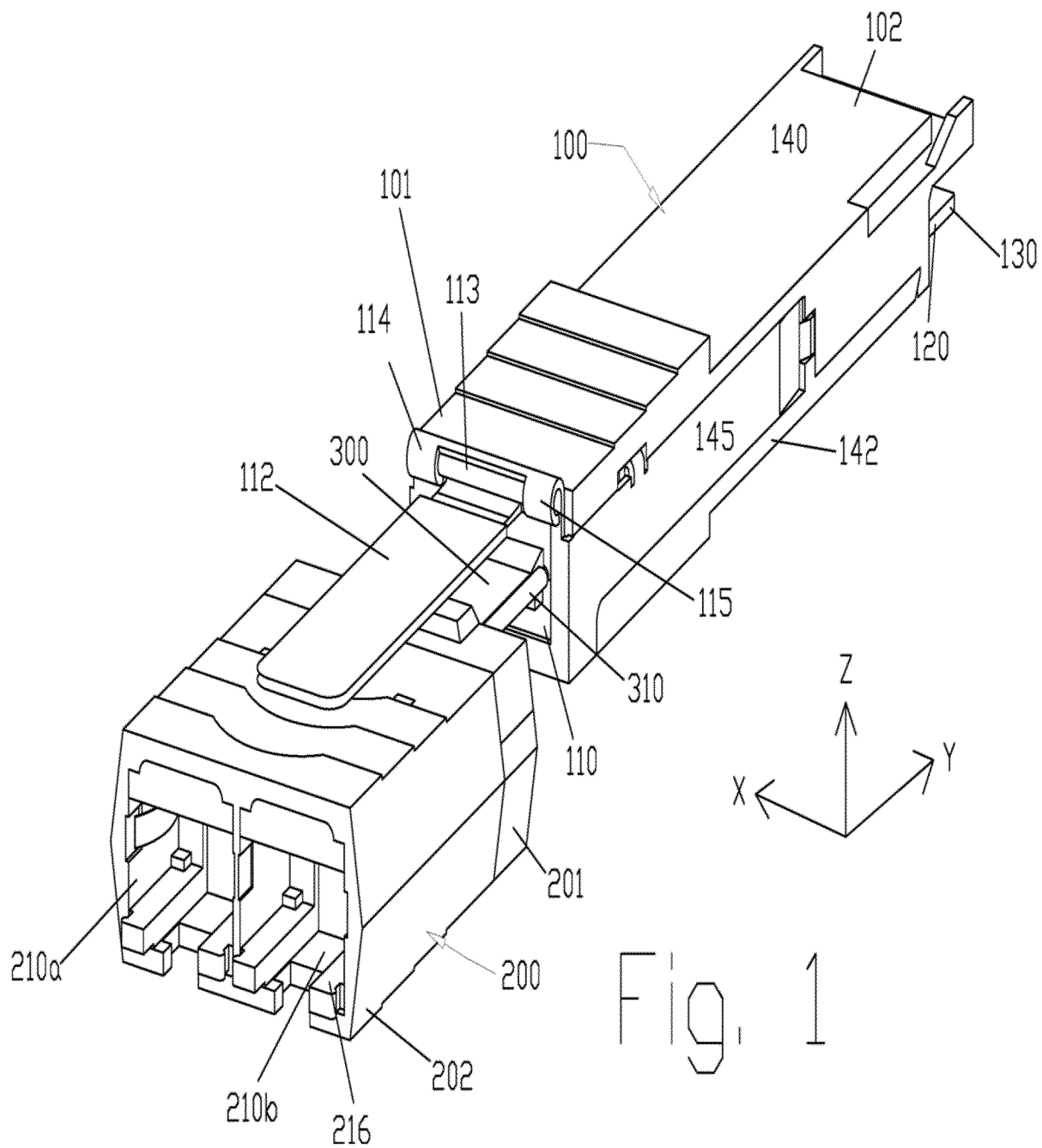
FIG. 1 is a perspective view of a module of the present invention.

Turning to FIG. 1 the pluggable module 100 is depicted in an embodiment having a housing top 111, a housing bottom 112 and a disengager button 113. In an embodiment the housing is compliant SFP and SFP+ specifications, so that front body housing 115 may be inserted into a cage of a host device (not shown) and electric connection is accomplished by an edge connector 132 mating with a corresponding connector on the mother board of the host device (not shown). In an embodiment, the host device may be a router, switcher, hub, blade, cable box, distribution point unit or other data or telecom equipment.

Figure 2:
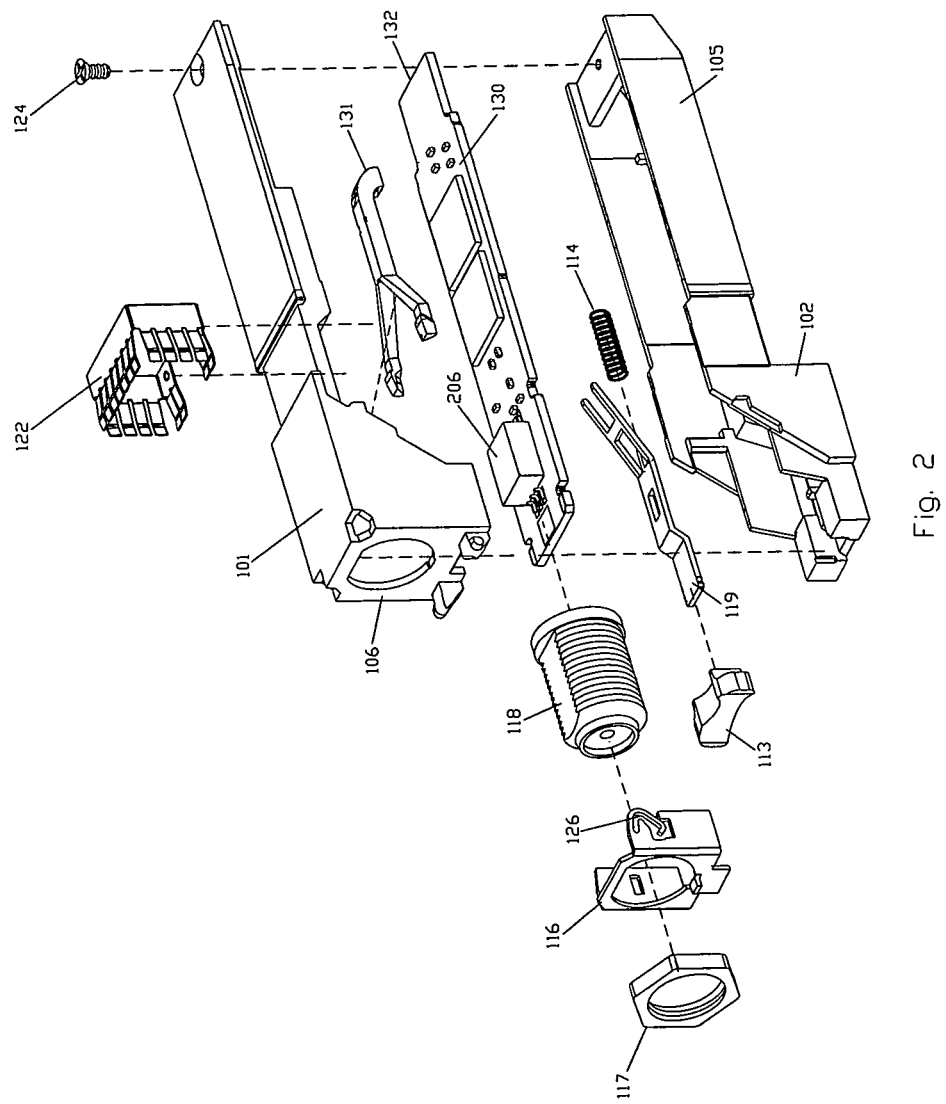
FIG. 2 is an exploded view of the module of FIG. 1.

Turning to FIG. 2 a flange 116 is provided in combination with nut 117 to secure an F-Type coaxial connector to a printed circuit board (PCB) 130. The flange 116 is stamped and formed with a resilient clip 126 that provides a compression contact against a solder pad of PCB 130. The pad, in an embodiment is connected to ground so that the flange 116 is grounded to facilitate Electro-Magnetic Interference (EMI) shielding for the module 100.

In an embodiment the module 100 includes a release lever 119,120. In first embodiment, the release lever (FIGS. 1 and 2) is a push style lever that allows a user to push button 113 in order to cause the module 100 to "pop" out of the host device a first distance from the host face plate (not shown). Once the module 100 is ejected to the first distance, there is room for the user to grab the sides of the module housing 101 (top half), 102 (bottom half) with his/her fingers in order to remove the module 100 the remaining distance, so that the entire module may be removed from a cage of a host device (in order to repair the module 100 or to upgrade of downgrade the host device with a new module having alternate functionality (e.g. copper to fiber)). Further description of the release lever 119 is provided with respect to FIGS. 8-14 below.

Figure 5:
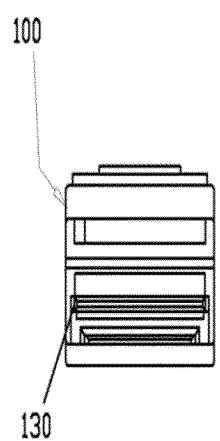
Figure 6:
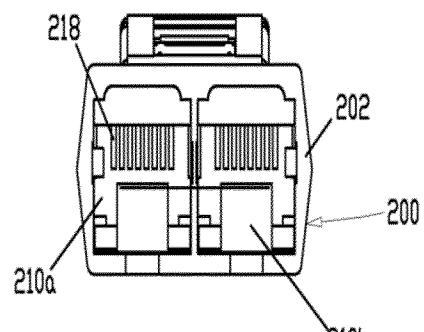

FIG. 2 also depicts EMI collar 122 to be clipped onto housing 101 (top half) of the module 100 within recess 129 (FIG. 5). The collar 122 includes fingers for engaging a face plate of a host device to ground the collar 122 to the host (not shown). In an embodiment the housing 100 is metallic, such as zinc alloy, zinc, aluminum or aluminum alloy, so that the collar 122 may ground to the housing 101 (top half), 102 (bottom half) to provide EMI shielding for the module 100. A fastener 124 attaches the top half of the housing 101 (top half) to the bottom housing 102 (bottom half) with the PCB 130 disposed between. Y-spacer 131 is mounted within upper half 101.

Figure 3:
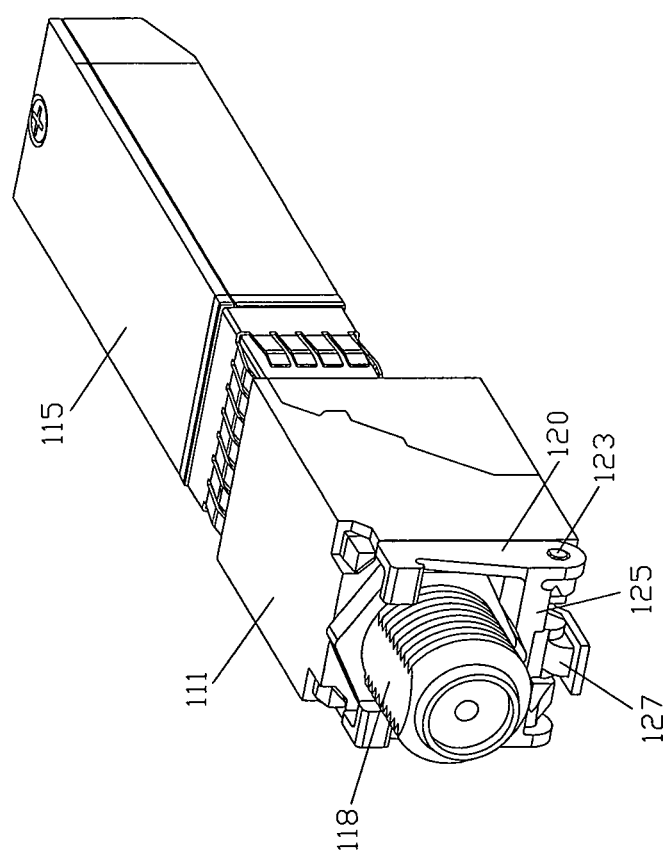
FIG. 3 is perspective view of an alternate embodiment of a module of the present invention.

Turning to FIG. 3, an alternative release lever 120 is depicted. In an embodiment, the lever provides a pivoting motion about axle 123 when a user grabs lever arm(s) 121 and pulls downward (from the position depicted in FIGS. 3 and 5) to activate release latch 127 so that the module is released from the host and the user, by continuing to rotate the lever arms 121, causes the arms to pivot around base bar 125 and axle 123, so that the release lever 120 moves to a second/horizontal orientation and continued pulling by the user will allow for complete removal of the module first end 105 (opposite second end 106) from the host. As depicted in FIG. 5, the lower housing 112 may have pivoting release lever 120, and also release lever 119 to accommodate rapid conversion of the module 100 from one version of the release lever to the next.

Figure 6:
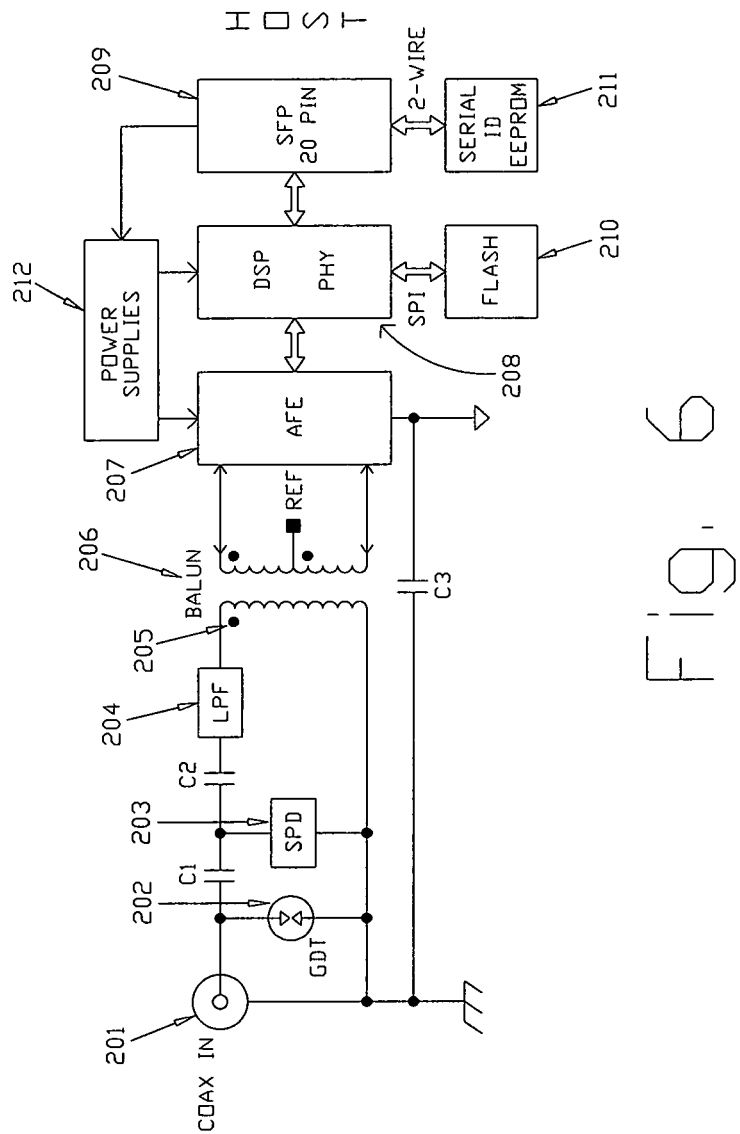
FIG. 6 is a block diagram of the electronics of the module.

FIG. 6 depicts an electronic diagram of an embodiment of the present invention. The module PCB 130 has circuitry and components including input via F-type connector input 201, a gas discharge tube (GDT) 202, a surge protection device (SPD) 203, a low pass filter (LPF) 204, and a balun chip 206 having a package including at least one surface mount contact 205. Chipsets are also provided on the PCB 130 for an analog front end (AFE) 207, a digital signal processor (DSP) core providing a Gfast/G.now VDSL/VSDL2 PHYSICAL (PHY) layer device 208, a 20 pin connector 209 compliant with an SFP or SFP+ specification (e.g. and edge connector), a memory device 210, such a FLASH chip, a serial ID EEPROM 211 and a power supply 212 (e.g. battery or DC supply).

Figure 7:
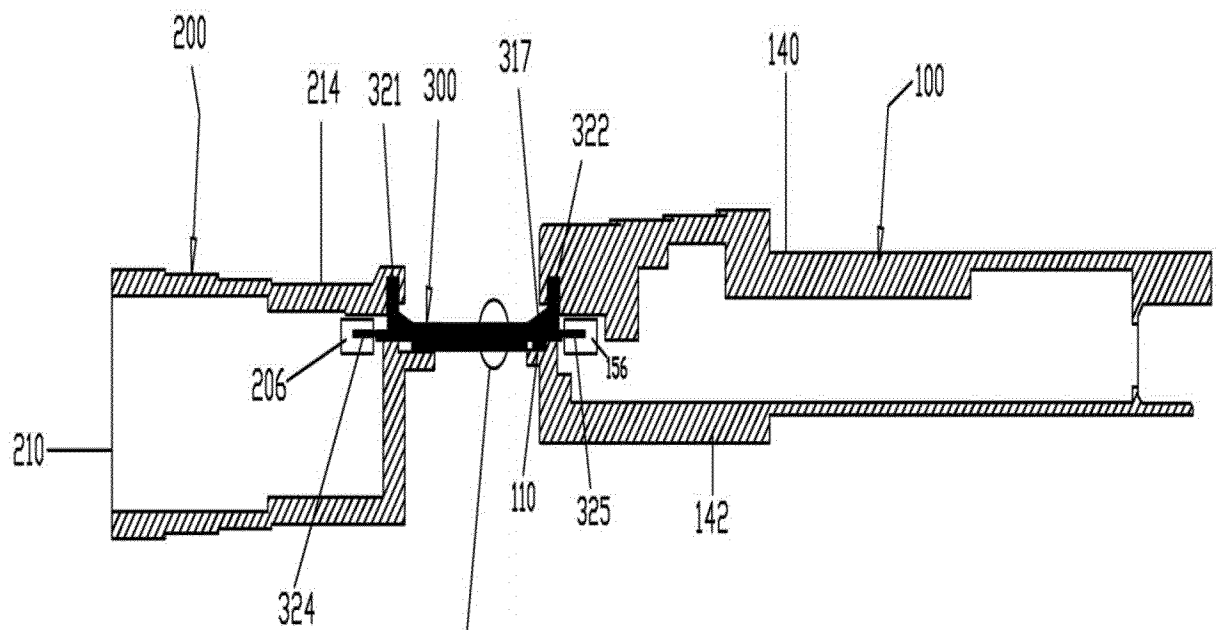
FIG. 7 is a block diagram of a balun of the module of the present invention.

FIG. 7 depicts balun chip 206 having through hold leads 1-3 on Primary (PRI) side and through hold leads 4-6 on Secondary (SEC) side.

A more detailed description of the above components 201-212 follows:

Coaxial input 201 such as an F-Type connector is preferred for telecommunications carriers with RG-59, 75Ω coaxial cable assets but other connector types can be adapted to the invention. A coupling capacitor C1, serves as a DC-block to eliminate DC-bias oftentimes present on a coaxial cable used to feed a remote low noise amplifier (LNA) or low noise block (LNB), from entering the electronics contained within the pluggable module. Nonetheless, the implementation can be adapted to incorporate a power splitter in place of the coupling capacitor C1 for those situations where a DC voltage is present on the coaxial cable for the purpose of remotely powering the host device that the module is plugged into.

Gas Discharge Tube (GDT) 202 is a component designed to dissipate the energy associated with a high over-voltage transient and is applied in the invention to protect against over voltage associated with a lightning strike event. The technology associated with GDT 202 has evolved sufficiently that today it is possible to incorporate one as the basis for lightning over-voltage protection in a device as compact as an SFP module. This is vital for the invention which can be connected to telecommunications carrier copper infrastructure that extends outdoors where it is vulnerable to lightning strike events.

Surge protection device (SPD) 203 has an arrangement of a type Zener diode designed with a fast transient response time used to limit over-voltage surges most typically associated with lightning strike events. The SPD 203 is implemented in conjunction with a GDT 202 to deliver the over-voltage protection required by telecommunications carriers for any equipment connected to their copper cable infrastructure.

Low Pass Filter (LPF) 204 is a collection of passive elements, capacitors, inductors and resistors, arranged to filter high frequency noise that might otherwise prove troublesome to the proper function of the invention. The LPF 204 can optionally be implemented to mitigate the influence and associated cross-talk resulting from other signals co-existing on the coaxial cable such as cable television (CATV) signals.

Balun (balanced unbalanced transformer) 206 is an electrical device that converts between a balanced signal (two signals working against each other where ground is irrelevant) and an unbalanced signal (a single signal working against ground or pseudo-ground). A balun can take many forms and may include devices that also transform impedances. The balun 206 may also provide a transformer component for converting between a single-ended, or unbalanced, input to a differential, or balanced, load. In one embodiment, the balun serves to transform between single-ended 75Ω coaxial cable and a 100Ω differential interface to-from the analog front-end (AFE). The invention improves on this approach by integrating a Gfast or G.now/G.hn balun into a pluggable module along with a native F-Type interface as well as the rest of the circuitry needed to implement an entire Gfast or G.now/G.hn physical layer connection. The balun used in the present invention is miniaturized by omitting the over-molding typical and usual for a stand-alone, external balun. The over-molding in an embodiment is omitted by design as a custom component for use in the present invention. Omitting the Balun 206 over-molding reduces component height and width. The balun 206 used in the present module 100 is miniaturized (e.g has a low profile package) by replacing standard through-hole mounting leads with custom surface mount contacts 205. The surface mount contacts are a feature of the custom balun 206 used for the present invention (FIG. 7).

Figure 14:
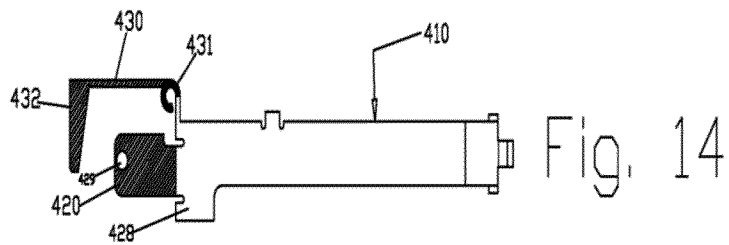
FIG. 14 is a side elevation view of a printed circuit board (PCB) of the present invention.
Figure 15:
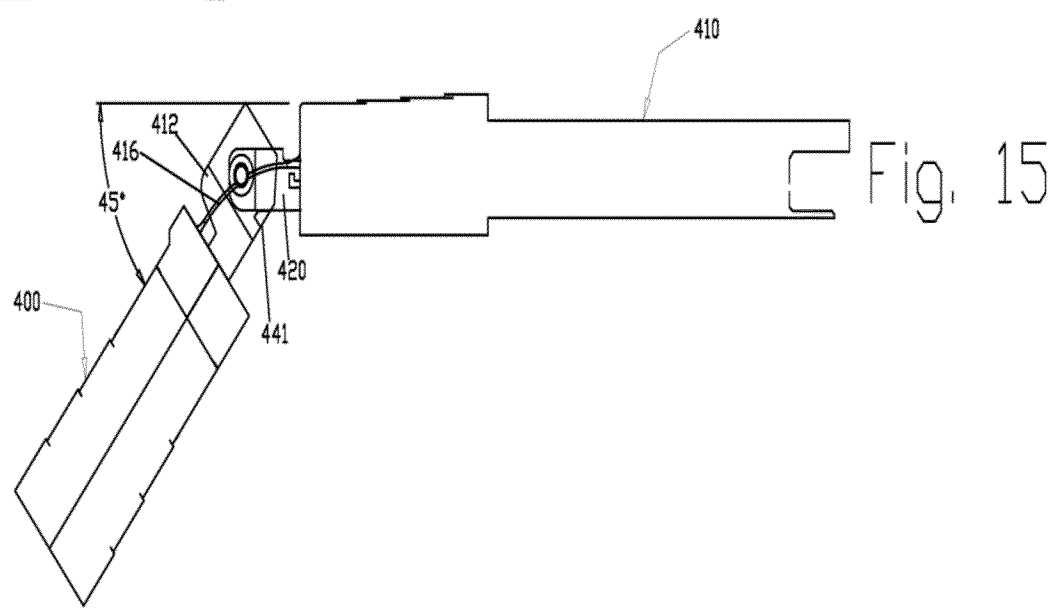
FIG. 15 is a perspective view of the bottom of the PCB of FIG. 14.

The incorporation of surface mount leads 205 for the balun 206 on a first/top side 130a, means that components 220 can be placed on the opposite/bottom side 130b of the printed circuit board 130 under the balun 206 (see FIG. 14-15).

Also providing a higher magnetic permeability for the balun 206 allows for a smaller ferrite core 225 and a smaller finished balun 206. The balun used in the module is miniaturized by selecting a ferrite core 225 with a high magnetic permeability. A larger, more typically sized balun uses lower cost, lower magnetic permeability ferrite cores.

Analog Front-End (AFE) 207 provides an integrated circuit interface circuit that resides between the balun 206 connected to the coaxial cable plant that carries complex modulated data and the digital core responsible for processing the demodulated baseband data. In the transmit direction, the AFE 207 is responsible for conditioning and amplifying the signal from the digital processing core for transmission through connected coaxial cable. In the receive direction the AFE is responsible for first normalizing the input signal amplitude then conditioning the complex modulated data inbound from the connected coaxial cable plant in order that it can be decoded by the digital processing core.

Digital Signal Processor/PHYSICAL layer device (DSP/PHY) 208 is an integrated circuit that resides between the AFE 207 and small form-factor pluggable (SFP) 20-pin host connector 209. The DSP/PHY 208 is responsible for adapting data between the host environment, typically Ethernet traffic in the form of a standard SGMII (serial gigabit media independent interface) The complex modulation format is necessary for transmission over the connected coaxial cable plant (via the AFE for signal conditioning and amplification).

Small Form-factor Pluggable (SFP) 20-pin connector 209 in an embodiment is an edge of the SFP transceiver PCB that mates with the corresponding SFP electrical connector on the host, consistent with the recommended pattern layout and pin assignment described in the SFP multi-source agreement (INF-9074i).

Flash memory 210 is a non-volatile memory chip that holds the configuration settings and information for the AFE 207 and DFE Serial ID EEPROM 211 is a non-volatile memory chip providing the memory map for static and dynamic data defined in the multi-source agreement SFF-8472. The static serial identification (ID) provides the host information that describes the transceiver module's capabilities, standard interfaces, manufacturer and other related information. The dynamic data is intended to provide the host with real time access to a device operating parameters such as voltage and temperature.

Power Supplies 212 is a system of DC/DC switching power supplies that converts a fixed 3.3V input voltage to the various voltage rails required for proper operation by the AFE 207, DFE, flash 210 and serial ID EEPROM 211.

Turning to FIGS. 8-13, an alternate embodiment of the release lever 119 will be described. The lever 119 is slidingly mounted into lower housing half 102 so that the lever body 150 includes three segments, the first segment 151 forming a generally "H" shaped release member 150, an opposite second segment 152 having side serrations 156 for receiving a button 113 thereon and a third segment 153 disposed between the first 151 and second segments 152, the third segment 153 having an opening 157 and a tab 158 extending into a bottom portion of the "H" shaped member 151.

Figure 8:
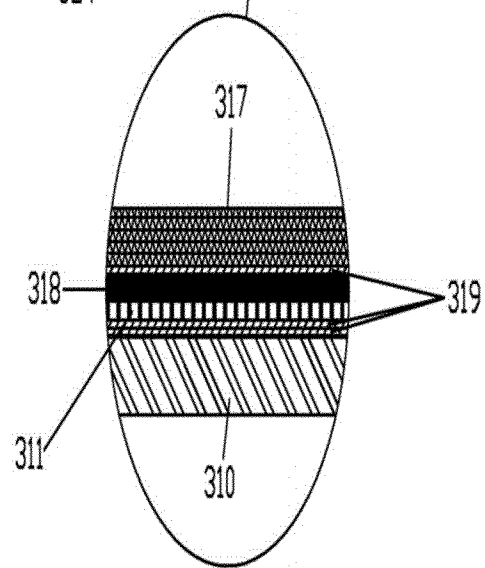
FIG. 8 is a side elevation cut-away view taken at line 8-8 from FIG. 1 depicting the push button in a first position.
Figure 9:
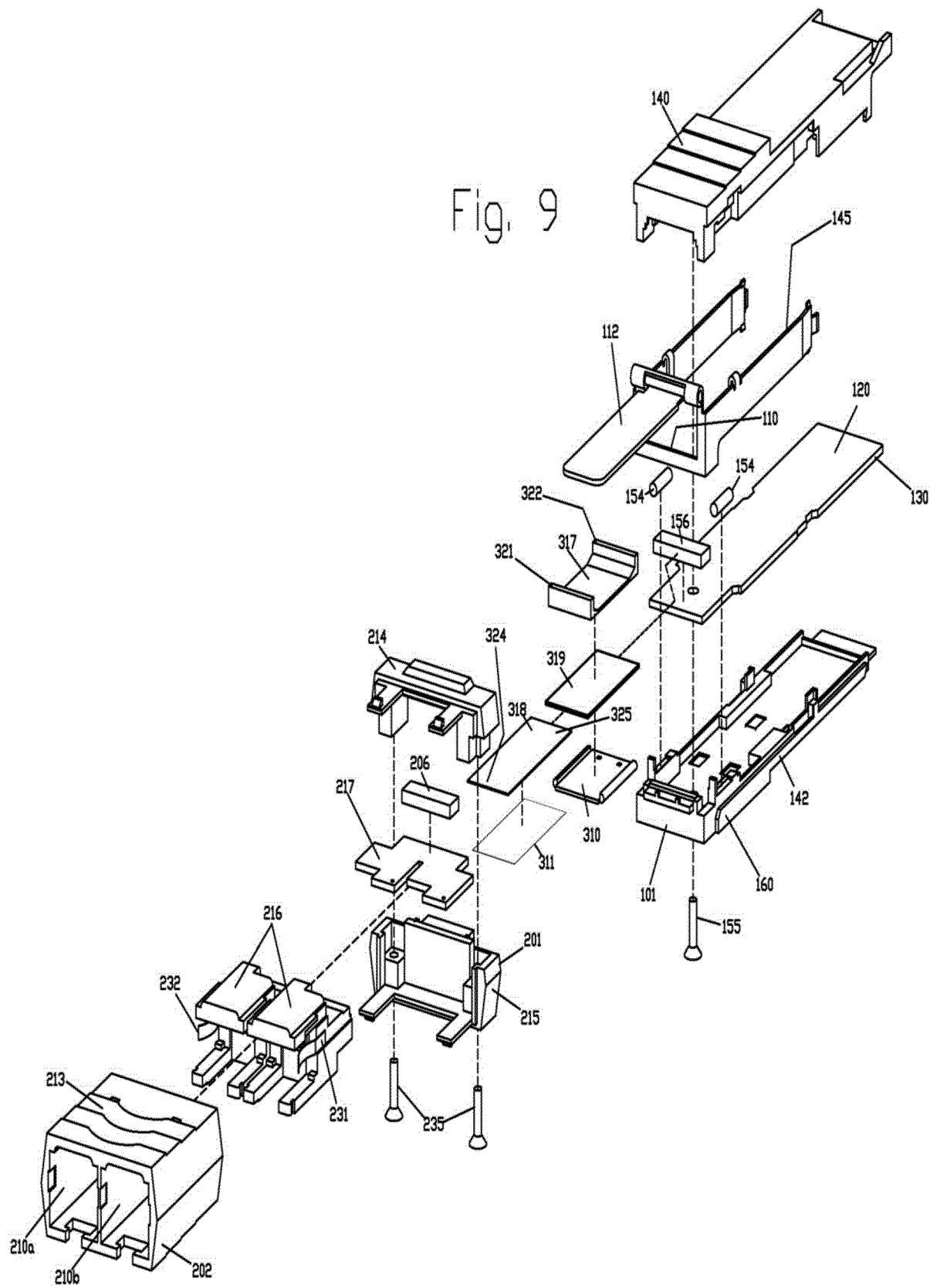
FIG. 9 is a side elevation cut-away view taken at line 8-8 from FIG. 1 depicting the push button in a second position.

The module 100 includes an enlarged end 160 (FIG. 1) having a lever mating area 161 including a finger 162 disposed within the opening 157, a resilient member 114 (e.g spring or rubber bushing) for receiving the tab 158 thereon and a pair of legs 155a,b of the "H" shaped segment 152 for sliding and engaging a release tab 159. So as depicted in FIGS. 8-9, a body 119 may be moved between a latched and unlatched condition (FIG. 9). By pressing on button 113 in direction of arrow A (FIG. 8). A user that applies sufficient counterforce to the resilient member 114, can move the first segment 151 against the release tab 159 to push the module housing backward in order to release the module 100 from the cage of the host device. As shown in FIG. 9, the resilient member 114 will then return the body 119 to the latched condition. The opening 157 is formed having a corresponding length to the distance required to move the module housing to the delatched condition. The finger 162 abuts the first end of the opening 157 when the body is the latched condition (FIG. 8) and abuts the second end of the opening when the body is in the unlatched condition (FIG. 9).

Figure 13A:
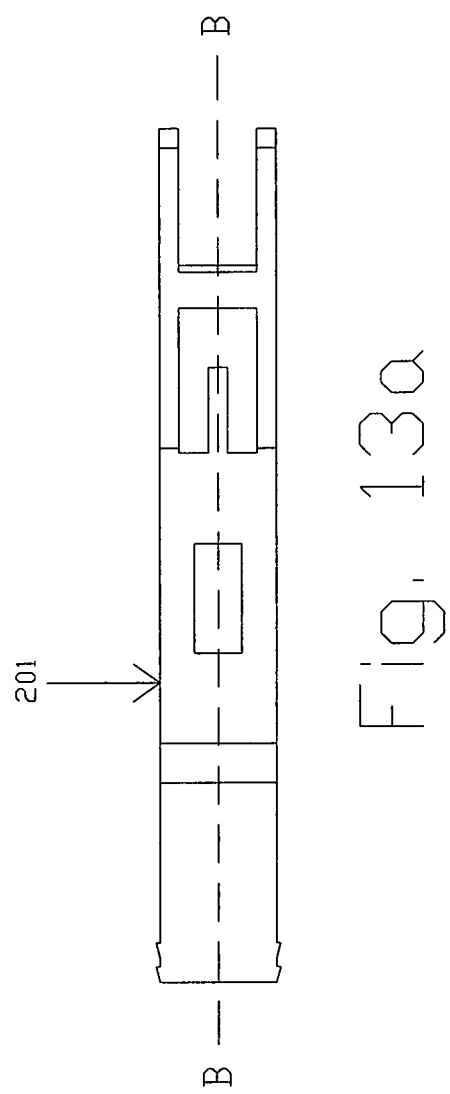
FIG. 13a is a plan view of the release lever sheet in a flattened state prior to forming.
Figure 10:
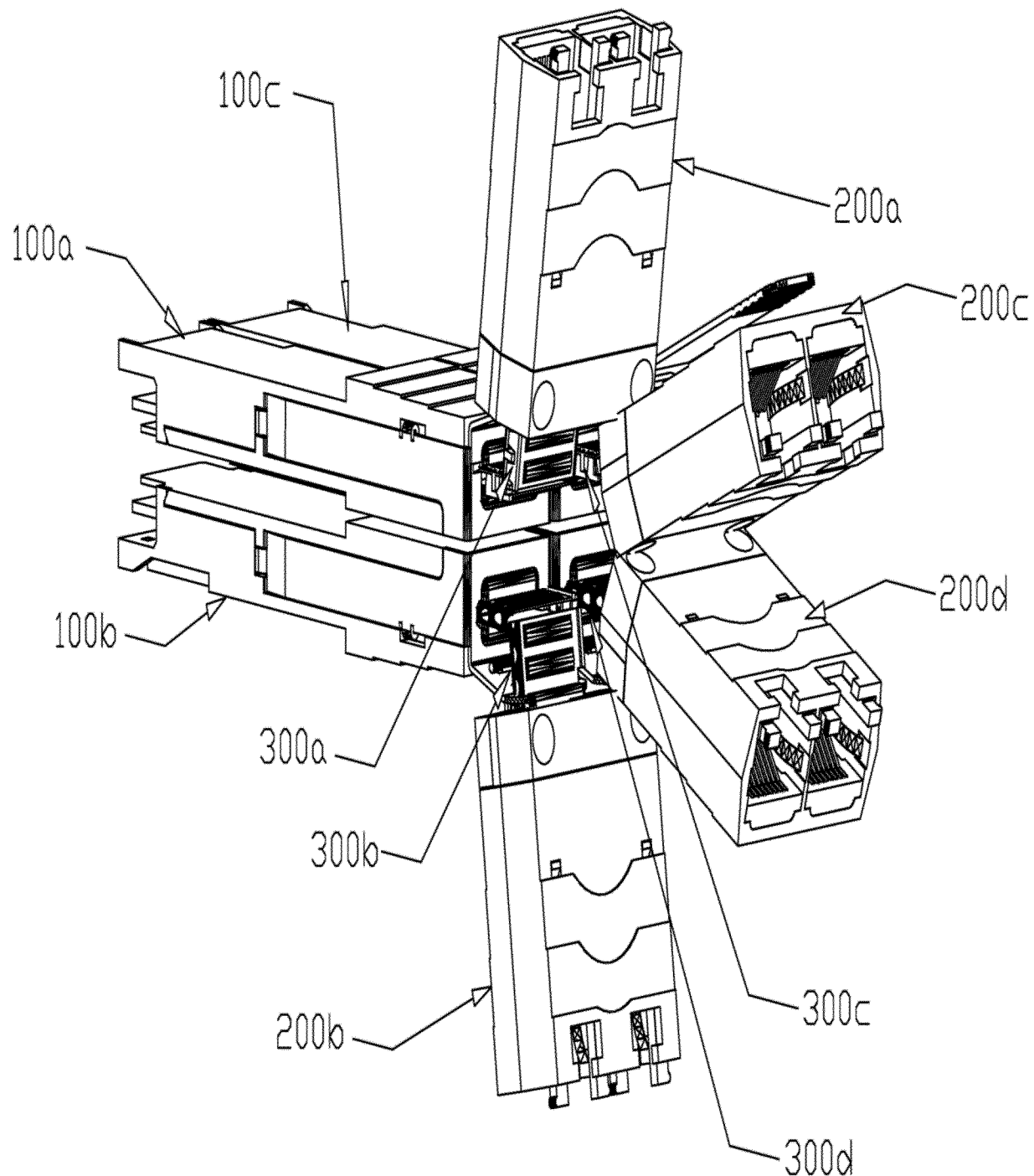
FIG. 10 is a plan view of a release lever sheet prior to final forming.

FIG. 10-11 depicts how the body 119 of the release lever 150 is manufactured. The body is stamped from a flat metal sheet as shown in FIG. 10. In FIG. 11 a machine is depicted for rolling and bending the body 119 in order to form the release lever 150 depicted in FIG. 13c.

Also, returning to FIG. 2 a flange 116 which serves as the means for aligning an F-type connector 118 to the main printed circuit board 130. Furthermore, in addition to accomplishing proper mechanical alignment relative to PCB 130, the mounting flange 116 includes the resilient clip 126 which is soldered to the PCB 130 to accomplish an electric connection to ground (GND).

In an embodiment, the module 100 of the present invention may be assembled as follows: a balun is obtained having a ferrite core having high magnetic permeability, having the overmolding removed and having surface mount leads (instead of through hole leads); mounting the balun to a first side of a printed circuit board (PCB) via a surface mount process; mounting other components to a second side of the PCB, casting a housing from an alloy such as zinc alloy or aluminum alloy, stamping a release lever from a flat sheet of metal so that the lever 150 is symmetrical about a centerline of the body of the lever, the centerfline B-B (FIG. 13a) bisecting the length of the lever 150; forming the release lever by bending the flat metal to form a first, second and third segment of the release lever and inserting the lever within a mating area of the lower housing half 102. The assembly further comprising capturing the PCB 130 and coaxial connector assembly within the upper and lower housing halves 101, 102 and the assembly including the flange 116 having the resilient clip 126, for mounting to the PCB and grounding the resilient clip 126 and F-type connector assembly 118. Finally, the EMI collar 122 is snapped onto the recess 129 of the housing 112.

With respect to FIGS. 1-15, the following components are provided as shown in the figures:
100—module
101—housing upper half
102 housing lower half
105—first housing end
111—housing top
112—housing bottom
113—Disengager button
114—Elastic member
115—Front body housing
116—Flange
117—Nut
118—F-Type coaxial connector assembly
119—release lever
120—Pivoting latch lever
121—Arm for pivoting latch lever
122—EMI collar
123—Axle for pivoting latch lever
124—fastener
125—Base connecting bar for latch lever
126—clip
127—Release latch
129—PCB support
130—printed circuit board
132—Edge connector to mate with host connector
150—lever body
160 enlarged end
201—input via F-type connector
202—GDT
203—SPD
204 LPF
205—surface mount contact
206—balun
207 AFE
208—DSP PHY
209—SFP 20 pin connector output
210—FLASH memory
211—Serial ID EEPROM
212—Power supply

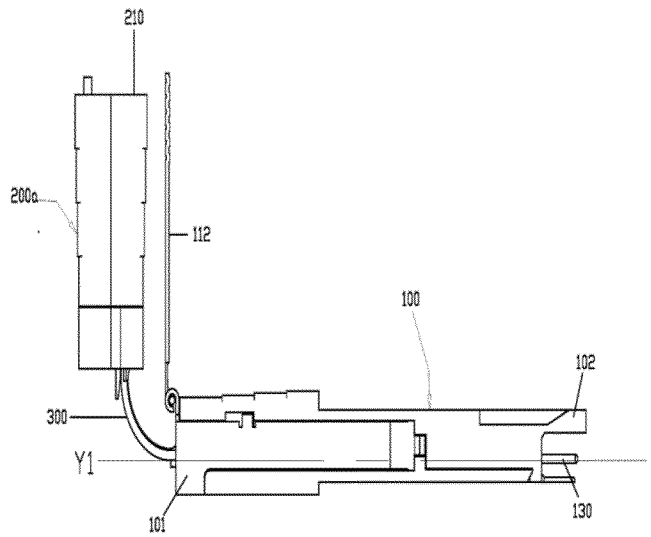

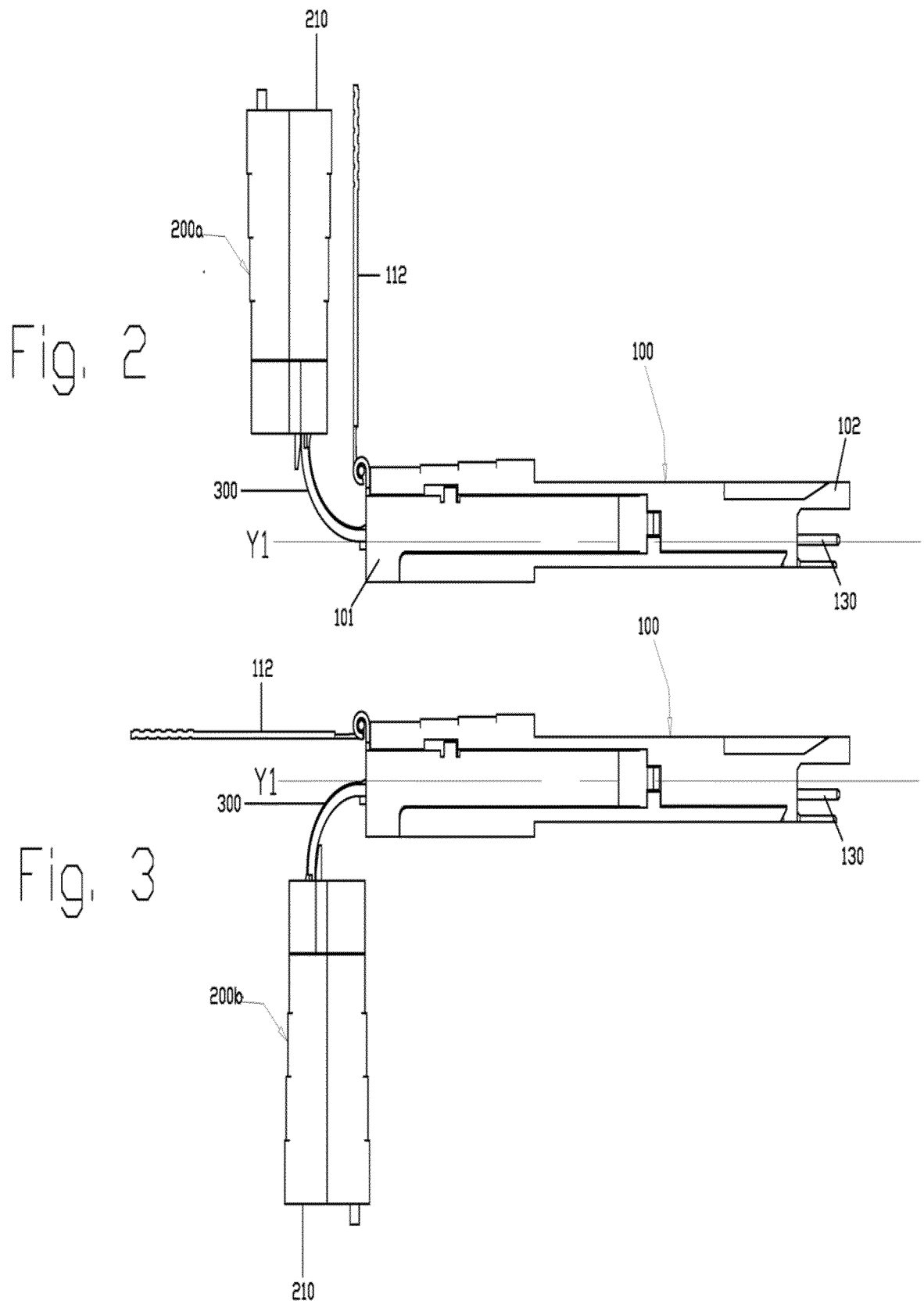

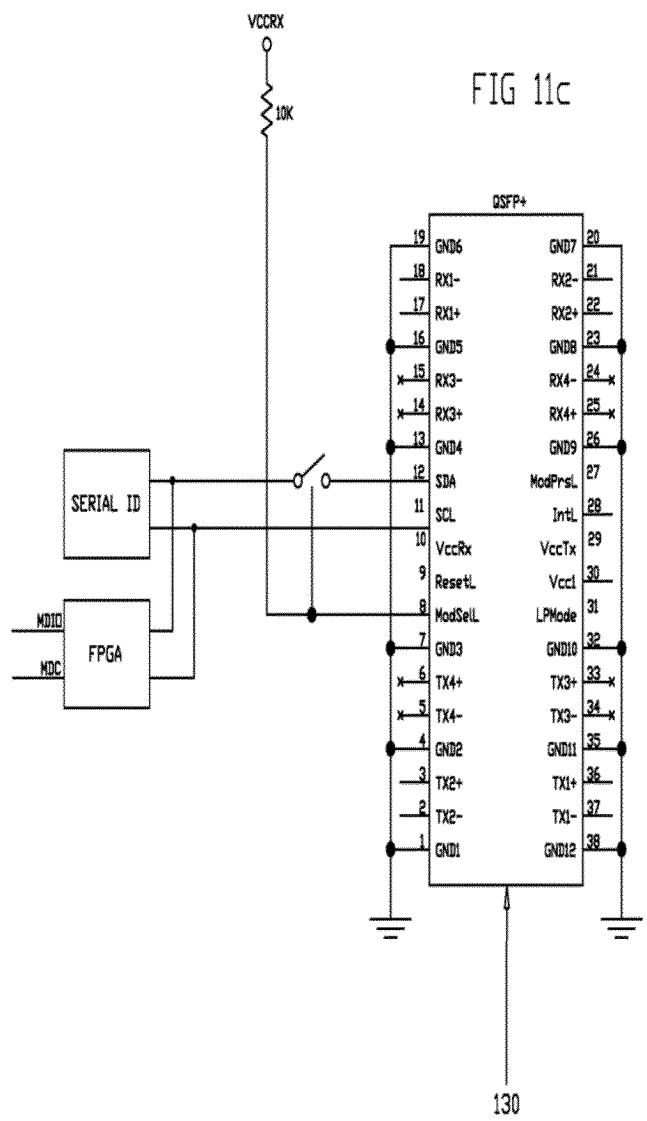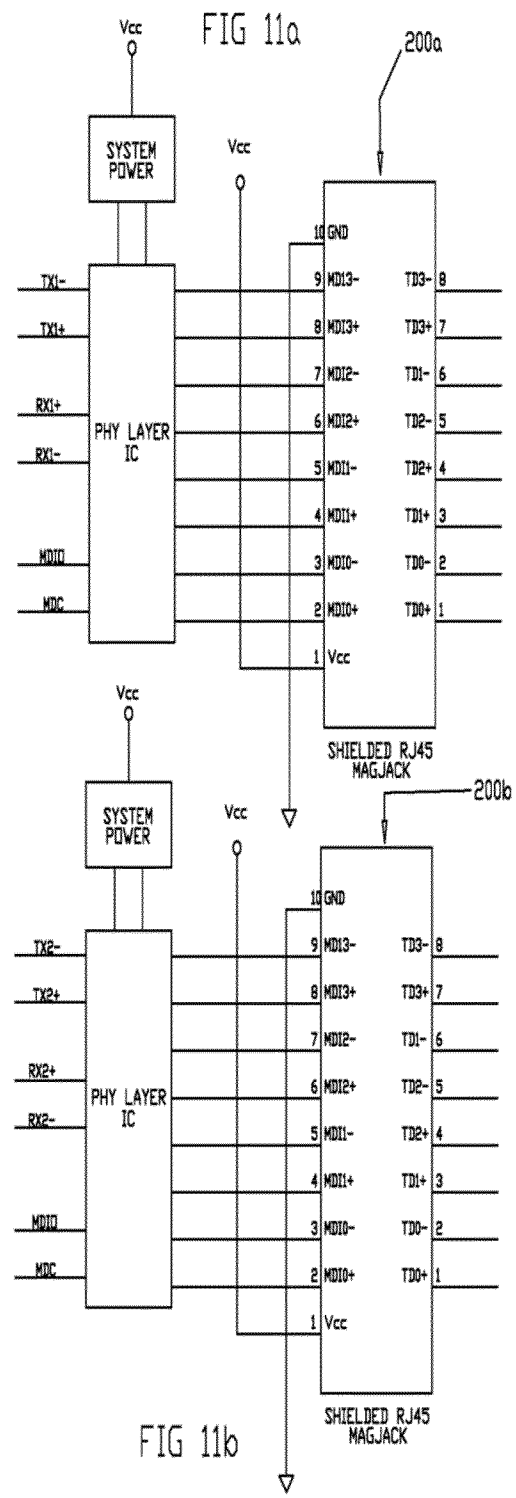

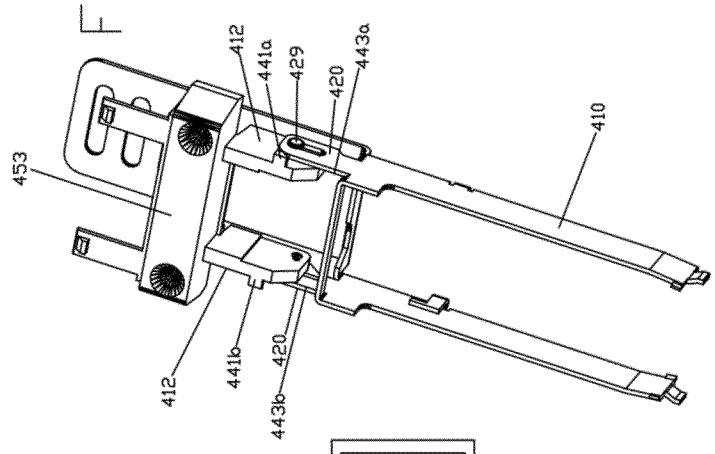
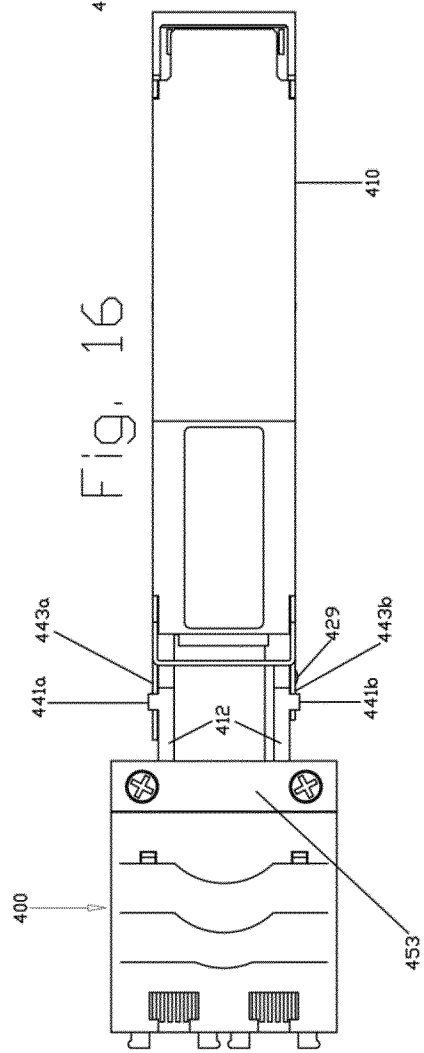

What is claimed:

1. A transceiver assembly for transmitting and receiving electrical signals comprising:
   a transceiver housing having a first end having a pluggable connector and an opposite second end having a passage in communication with a printed circuit board mounted in the housing,
   a peripheral connector having a housing for enclosing a printed circuit board and a first end and an opposite second end, the second end having a receptacle opening for receiving a plug, the receptacle including one of an RJ-45 receptacle, an MPO receptacle and an LC receptacle,
   a flex circuit disposed between the first end of the peripheral connector and the second end of the transceiver housing, the peripheral connector capable of being displaced with respect to the transceiver housing via the flex circuit, the flex circuit capable of deflection along an X-axis and Y-axis; and
   the housing having an anti-deflection member for restricting deflection of the flex circuit along the Y-axis.

2. The transceiver assembly of claim 1 wherein the transceiver housing having a center line extending between the first and second end and the flex circuit allowing for displacement of the peripheral connector with respect to the center line.

3. The transceiver assembly of claim 2 wherein the peripheral connector is displaced laterally with respect to the center line upon deflection of the flex circuit and the flex circuit is attached to the transceiver housing in a plane disposed from the center line.

4. The transceiver assembly of claim 1 wherein the flex circuit includes circuit traces for carrying electrical signals between the transceiver housing and the peripheral connector.

5. The transceiver assembly of claim 1 wherein the flex circuit includes a spacer member, foil wrap and a strain relief.

6. The transceiver assembly of claim 1 wherein the flex circuit is attached to the transceiver housing by one of a Zero Insertion Force (ZIF) connector, a butt joint and an integral embedded connection of the flex circuit to a rigid board of the transceiver housing.

7. The transceiver of claim 1 wherein a Zero Insertion Force (ZIF) connector is disposed in the peripheral connector and receives an end of the flex circuit.

8. The transceiver assembly of claim 2 wherein the flex circuit is a generally flat sheet that allows for lateral movement but prevents side to side movement and the center line defines a Y-axis, the flex circuit including an X-axis that is perpendicular to the Y-axis, and a Z-axis that is perpendicular to the X-axis and forms a YZ plane and the flex circuit allows for movement of the peripheral connector in the YZ-plane and movement of the peripheral connector is prevented along the X-axis and Y-axis.

9. The transceiver assembly of claim 8 further comprising a pivot arm extending from the transceiver housing and a pivot extension protruding from the peripheral connector, the pivot arm and pivot extension being pivotally attached and restricting movement of the flex circuit in the Y-axis.

10. The transceiver assembly of claim 9 further comprising an anti-deflection member to limit to a predetermined angle of deflection of the flex circuit.

11. The transceiver assembly of claim 10 wherein the anti-deflection member includes a flap pivotally attached to the transceiver housing.

12. The transceiver assembly of claim 11 wherein the flap having a pivot point on the transceiver housing and a leg opposite the pivot point and the leg received in a gap of the pivot extension.

13. The transceiver assembly of claim 10 further comprising a deflection control member disposed on the pivot arm in order to control the angle of deflection of the flex circuit and peripheral connector.

14. The transceiver assembly of claim 13 wherein the deflection control member includes a détente extending from the pivot arm and engaging an edge of the pivot extension and the cross-sectional shape of the détente controlling the angle deflection of the flex circuit and peripheral connector.

15. A flex circuit for transmitting electrical signals to and from a transceiver and a peripheral device, the circuit comprising:
   a spacer member, foil wrap and a strain relief;
   wherein the flex circuit is a generally flat sheet and allows for lateral movement but prevents side to side movement and the flex circuit having a center line that defines a Z-axis, the flex circuit including an X-axis that is perpendicular to the Z-axis, and a Y-axis that is perpendicular to the X-axis to form a YZ plane and the flex circuit provides for movement in the Z-axis and the YZ plane and movement of the flex circuit is prevented in the X-axis; and
   an anti-deflection member disposed adjacent to the flex circuit and preventing deflection of the flex circuit in the Y-axis.

16. The flex circuit of claim 15 wherein the flex circuit carries electrical signals between a transceiver housing and a peripheral connector.

17. The flex circuit of claim 16 wherein the flex circuit is connected to the transceiver housing and the peripheral connector by Zero Insertion Force (ZIF) connectors.

18. The flex circuit of claim 15 wherein the flex circuit is disposed between the peripheral connector and the transceiver housing.

19. A method of controlling deflection of a peripheral connector with respect to a transceiver device comprising the steps of:
   providing a flex circuit formed of foil wrap and a strain relief, the flex circuit disposed between the peripheral connector and a transceiver housing, the peripheral connector having a receptacle for receiving a plug;
   restricting deflection of the peripheral connector in a first direction via an anti-deflection member; and
   controlling the deflection of the peripheral device connector in a second direction opposite the first direction via a deflection control member, the deflection control member disposed adjacent to the flex circuit and restricting deflection between approximately zero and 120 degrees.

20. The method of claim 19 wherein the anti-deflection member includes a flap having a leg for engaging a gap of the peripheral connector in order to prevent deflection of the flex circuit.

21. The method of claim 20 further comprising the steps of adjusting the length of the leg in order to adjust the deflection angle of the flex circuit with respect to the transceiver housing.

22. The method of claim 19 wherein the deflection control member includes a notch disposed on the peripheral connector that engages a détente on the transceiver housing in order to control the deflection of the flex circuit.

23. The method of claim 19 further comprising the steps of providing for lateral movement of the flex circuit while restricting side to side movement and the flex circuit having a center line that defines a Y-axis, the flex circuit including an X-axis that is perpendicular to the Y-axis, and a Z-axis is perpendicular to the X-axis and forming a YZ plane;
  allowing for deflection of the flex circuit in the YZ plane; and
  restricting deflection of the peripheral connector in the X-axis and Y-axis.

24. The method of claim 22 wherein the flex circuit is connected to the transceiver housing and the peripheral connector by Zero Insertion Force (ZIF) connectors.

25. The method of claim 23 wherein the flex circuit has a planar construction that restricts movement of the flex circuit in the X-axis and Y-axis.

26. The method of claim 23 further comprising the step of restricting deflection of the flex circuit in the X-axis and Y-axis via a pivot arm attached to a pivot extension disposed adjacent the flex circuit on the peripheral connector.

\* \* \* \* \*

UNITED STATES PATENT AND TRADEMARK OFFICE
CERTIFICATE OF CORRECTION

| | | |
|---|---|---|
| PATENT NO. | : 10,367,286 B2 | Page 1 of 19 |
| APPLICATION NO. | : 15/859906 | |
| DATED | : July 30, 2019 | |
| INVENTOR(S) | : Robert Skepnek, Joseph Llorens and Alexandros Pirillis | |

It is certified that error appears in the above-identified patent and that said Letters Patent is hereby corrected as shown below:

On the Title Page

Delete the title page and substitute therefore with the attached title page consisting of the corrected illustrative figure.

Item (57) Abstract, Lines 1-8, should read:
--A transceiver assembly is provided that includes a transceiver housing having first end, having a connector and an opposite second end having a passage in communication with a printed circuit board mounted in the housing. A peripheral connector having a first end and opposite second end includes a receptacle opening at the second end. A flex circuit is disposed between the first end of the peripheral connector and the second end of the transceiver housing. The peripheral connector is capable of being displaced with respect to the transceiver housing via the flex circuit.--.

Under abstract "26 Claims, 13 Drawing Sheets" should read --26 Claims, 9 Drawing Sheets--.

In the Drawings

Please replace FIGS. 1-15 with FIGS. 1-17 as shown on the attached pages.

In the Specification

Column 1, Line 1-Column 9, Line 4, should read:
--TRANSCEIVER MODULE WITH FLEX CIRCUIT
 This application is a continuation of application no. 15/406,920 filed January 16, 2017. The present invention relates to a transceiver module assembly for providing high speed data transfer and including a transceiver module having a flex circuit and peripheral connector.
BACKGROUND
Copper transceiver modules are well known for high performance integrated duplex data links for bi-directional communication over copper or fiber cables. Such modules provide high speed communication links providing up to 10 Gigabit Ethernet transmissions over Cat 6a/7 cables. Devices Signed and Sealed this
Twenty-third Day of June, 2020

Andrei Iancu
*Director of the United States Patent and Trademark Office* are known such as Quad Small Form-factor Pluggable (QSFP) transceiver modules that provide hot pluggable modules that integrate four transmit and four receive channels with a standard Multi-fiber Push On (MPO) fiber-optic connector for high density applications. Such QSFP modules may also provide for copper transmission. As well, a QSFP enhanced transceiver, such as a QSFP+ module enables data communications at data rates of up to 40 Gigabits per second (40G). Four 10G data paths transmit and receive across the QSFP+ to provide 40G data transmit and receive channels.

Such transceiver modules are also known to include copper 10G-Base-T ports that have Registered Jack (RJ) 45 connectors (as defined by the Institute of Electrical and Electronic) (IEEE Standard 802.3an-2006). Such RJ-45 connectors, however, are difficult to use in densely populated racks of equipment in data centers. The present invention overcomes those disadvantages.

SUMMARY

The present invention provides a transceiver assembly comprising a transceiver housing having a first end, having a connector and an opposite second end having a passage in communication with a printed circuit board mounted in the housing. A peripheral connector is provided having a first end and an opposite second end, the second end having a receptacle opening. A flex circuit is disposed between the first end of the peripheral connector and the second end of the transceiver housing, the peripheral connector being capable of being displaced with respect to the transceiver housing via the flex circuit.

In an embodiment the transceiver housing may have a center-line extending between the first and second end of the flex circuit allowing for displacement of the flex circuit with respect to the center-line. In an embodiment, the peripheral connector is displaced laterally with respect to the center-line upon flexing of the flex circuit and the flex circuit is attached to the transceiver housing in a plane disposed from the center-line.

In an embodiment the flex circuit includes circuit traces for carrying electrical signals between the transceiver housing and the peripheral connector. In an embodiment the flex circuit includes a spacer, foil wrap and strain relief. In an embodiment a zero insertion force (ZIF) connector is disposed in the housing and receives an end of the flex circuit. In an embodiment, the zero insertion force (ZIF) connector is disposed in the peripheral connector and receives an end of the flex circuit. In an embodiment the flex circuit may allow for lateral movement but prevent side to side movement and the center line defines a Z axis plane.

In an embodiment a pivot arm extending from the transceiver housing and a pivot extension protruding from the peripheral connector are provided and the pivot arm and pivot extension may be pivotally attached and restrict movement of the flex circuit in the Y-axis plane. In an embodiment an anti-deflection member is provided to limit the angle of deflection of the flex circuit. In an embodiment the anti-deflection member includes a flap pivotally attached to the transceiver housing.

In an embodiment the flap may have a pivot point on the transceiver housing and a leg opposite the pivot point and the leg received in a gap of the pivot extension. In an embodiment a deflection control member may be disposed on the pivot arm in order to control the angle of deflection of the flex circuit and peripheral connector.

In an embodiment the flex circuit may include an X-axis that is perpendicular to the Z-axis and a Y-axis that is perpendicular to the X-axis. The Y axis and Z axis form a YZ plane and the flex circuit restricts movement of the peripheral connector and along the X-axis and Y-axis but allow movement within the ZY plane. In an embodiment the flex circuit has a planar construction that prevents movement in the Y-axis and X-axis.

The present invention provides a flex circuit comprising a spacer, foil wrap and a strain relief. The invention includes the flex circuit that allows for lateral movement but prevents side to side movement and the flex circuit having a center line that defines a Y-axis, the flex circuit including an X-axis that is perpendicular to the Z-axis and the Y-axis that is perpendicular to an X-axis and the flex circuit provides for movement in the YZ plane and movement of the peripheral connector is prevented in the Y-axis or X-axis.

In an embodiment the flex circuit carries electrical signals between a transceiver housing and a peripheral connector. In an embodiment the flex circuit is connected to the transceiver housing and the peripheral connector by a zero insertion force (ZIF) connector. In an embodiment the flex circuit has a planar construction that prevents movement of the flex circuit in the Y-axis. The invention provides for a method of transmitting electrical signals between a transceiver housing and a peripheral connector comprising the steps of providing a flex circuit formed to the foil wrap and a strain relief, the flex circuit having a planer form, mating a first end of the flex circuit to the transceiver using zero insertion force (ZIF) and mating a second end of the flex circuit to the peripheral connector using zero insertion force.

In an embodiment the method further provides the flex circuit including signal lines for transmitting electrical signals between the transceiver housing and the peripheral connector. In an embodiment the method further comprises the steps of flexing the flex circuit in a lateral direction in order to provide access to the peripheral connector when the transceiver housing is mounted to a tightly spaced rack.

In an embodiment the method includes a transceiver housing including at least a pair of peripheral connectors and corresponding flex circuits and a first peripheral connector flexed to a first position and a second peripheral connector flexed in an opposite direction. In an embodiment the method further comprises the steps of providing for lateral movement of the flex circuit or restricting side to side movement and the flex circuit having a center line that defines as Z-axis the flex circuit including an X-axis that is perpendicular to the Z-axis and the Y-axis that is perpendicular to the X-axis, providing for movement of the flex circuit in the YZ-plane and restricting movement of the peripheral connector in a Y-axis and X- axis.

In an embodiment the method further comprises the flex circuit being connected to the transceiver housing and the peripheral connector by zero insertion force (ZIF) connectors. In an embodiment the method further comprising the flex circuit having a planar construction that prevents movement of the flex circuit in the Y-axis plane.

The invention provides a method of controlling deflection of a peripheral connector with respect to a transceiver housing comprising the steps of providing a flex circuit formed of foil wrap and a strain relief, the flex circuit disposed between the peripheral connector and the transceiver housing and restricting deflection of the peripheral connector in a first direction via an anti-deflection member; and controlling the deflection of the peripheral device connector in a second direction opposite the first direction via a deflection control member.

In an embodiment the anti-deflection member may include a flap having a leg for engaging a gap of the peripheral connector in order to prevent deflection of the flex circuit. In an embodiment the method includes the steps of adjusting the length of the leg in order to adjust the deflection angle of the flex circuit with respect to the transceiver housing. In an embodiment the control member may include a détente disposed on the peripheral connector that engages an edge of the transceiver housing in order to control the deflection of the flex circuit.

In an embodiment the steps providing for lateral movement of the flex circuit while restricting side to side movement and the flex circuit having a center line that defines a Z-axis, the flex circuit including an X-axis that is perpendicular to the Z-axis, and a Y-axis that is perpendicular to the X-axis, allowing for deflection of the flex circuit in the YZ-plane and restricting deflection of the peripheral connector in the Y-axis and X-axis.

In an embodiment, the method further comprises the flex circuit connected to the transceiver housing and the peripheral connector by Zero Insertion Force (ZIF) connectors. In an embodiment the flex circuit has a planar construction that restricts movement of the flex circuit in the Y-axis plane. In an embodiment, the further comprising the step of restricting deflection of the flex circuit in the Y-axis plane via a pivot arm attached to a pivot extension disposed adjacent the flex circuit

BRIEF DESCRIPTION OF THE DRAWINGS

Figure 4:
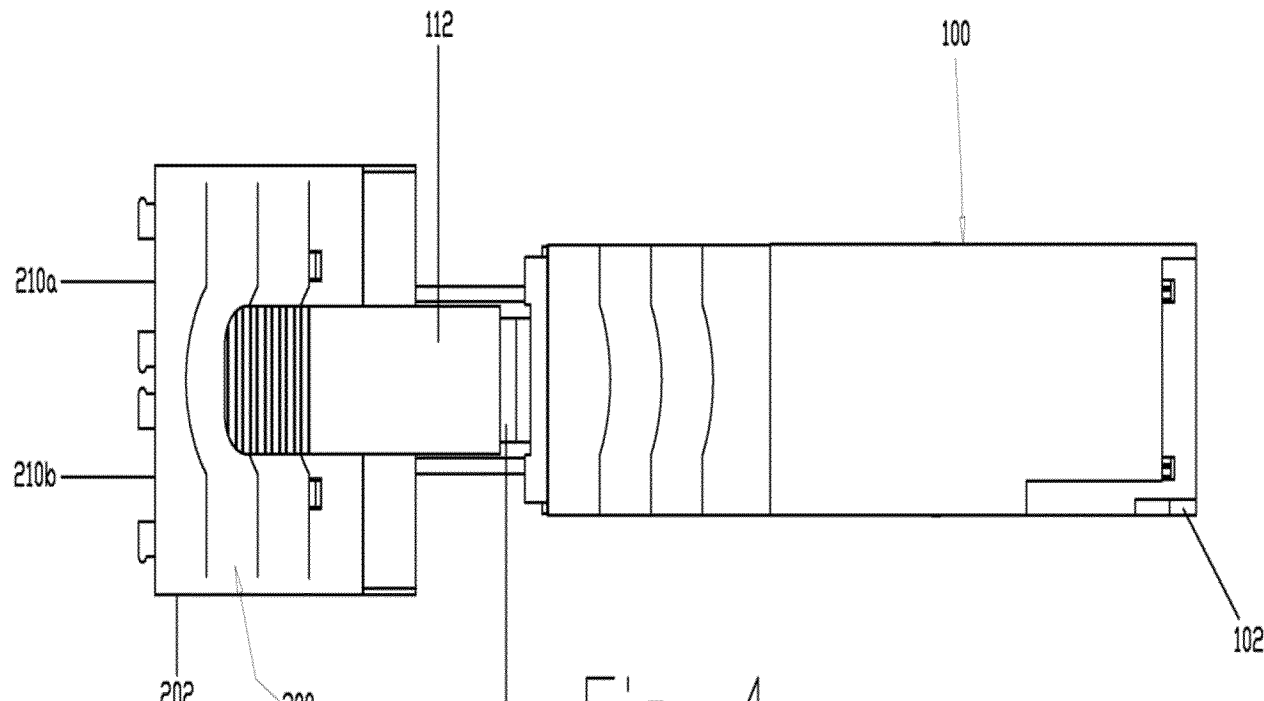
FIG. 4-5 is an exploded perspective view of the module of FIG. 3.
Figure 13:
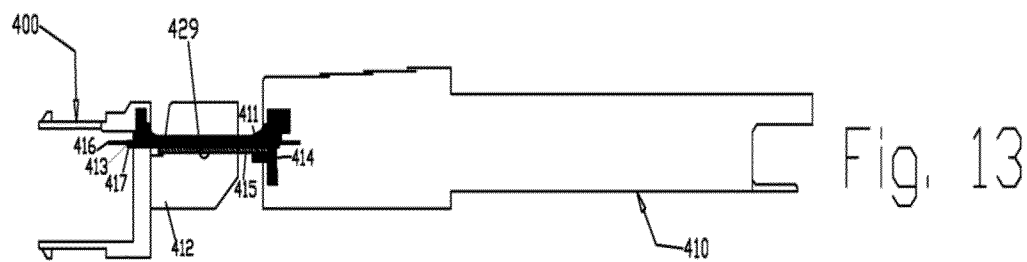
FIG. 13b is a side elevation view of the sheet of FIG. 13a, after forming.
FIG. 13c is a perspective view of the release lever of FIG. 13b.
Figure 12:
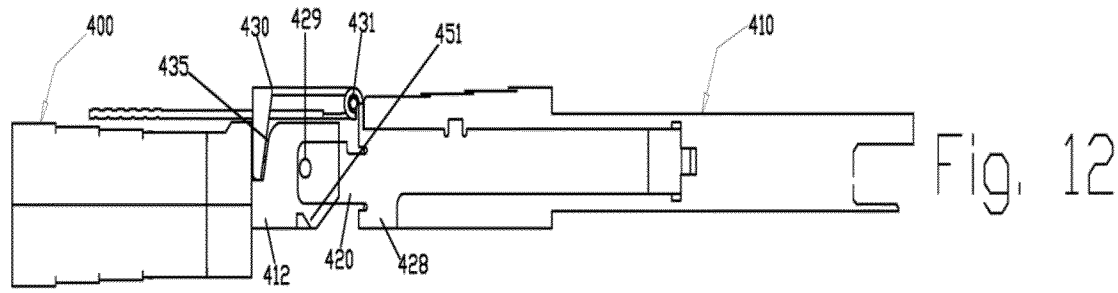
FIG. 12 is side elevation exploded view of the module of FIG. 1.

Fig. 1 is a perspective view of the transceiver module assembly and peripheral connector of the present invention;

Fig. 2 is a side elevation view of the transceiver module of Fig. 1 depicting the peripheral connector extended in a laterally upward direction;

Fig. 3 is a side elevation view of the transceiver module of Fig. 1 depicting the peripheral connector laterally displaced in a downward direction;

Fig. 4 is a plan view of the transceiver module of Fig. 1;

Fig. 5 is an end view of the transceiver module of Fig. 4;

Fig. 6 is a view of the opposite end of the transceiver module and peripheral connector assembly of Fig. 4;

Fig. 7 is a side elevation section view of Fig. 4 taken along a center line;

Fig. 8 is an exploded section view of area A of the flex circuit of Fig. 7;

Fig. 9 is a perspective exploded view of the transceiver module assembly of the present invention;

Fig. 10 is an alternate embodiment depicting multiple transceiver modules of the present invention;

Fig. 11a-c are circuit diagrams of transceiver module assemblies of the present invention;

Fig. 12 is a side elevation of an alternate embodiment of a transceiver module assembly and peripheral connector of the present invention;

Fig. 13 is a side elevation partial cut-away view of the assembly of Fig. 12;

Fig. 14 is a side elevation view of transceiver module of Fig. 12;

Fig. 15 is a side elevation view of the assembly of Fig. 12 depicting the peripheral connector offset at a 45 degree angle;

Fig. 16 is a plan view of an alternate embodiment of a flex circuit assembly; and Fig. 17 is a perspective view of the assembly of Fig. 16.

The figures depict various embodiments of the present invention for purposes of illustration only. One skilled in the art will readily recognize from the following discussion that alternative embodiments of the structures and the methods illustrated herein may be employed without departing from the principles of the invention described herein.

DETAILED DESCRIPTION

Figures 1-17 depict embodiments of the present invention. Figure 1 depicts a transceiver housing 100 having a first end 101 and a second end 102. The first end 101 includes a passage 110. The second end 102 includes a printed circuit board 120 extending from the second end 102 and forming an edge connector 130. A pull tab 112 extends from the first end 101 and is pivotally attached to the transceiver housing 100 via rod 113 that is disposed within a pair of hinge members 114 and 115.

The transceiver housing 100 is comprised of an upper housing 140 and a lower housing 142. A frame member 145 is disposed between the upper housing 140 and lower housing 142. The transceiver module housing, in an embodiment is compliant with the QSFP + specification SFF-8436, which is incorporated herein by reference. The printed circuit board 120 includes componentry to allow for high speed data transmission which may support links of up to 30 meters using CAT 6A\7 cable. The module may be IEEE 802.3-an compliant. The module may include advance DMI cancellation algorithms, low EMI admissions, 12 C2 wire serial interface for serial ID, MDIO two wire interface for station management and registered support. The transceiver module may include auto-negotiate with other 10G-based-T phy. The transceiver module supports 1G\100Mbps modes of operation. The module provides automatic detection and correction of writing and polarity swaps. The module may provide multiple loop back modes for testing and troubleshooting. The module may provide built-in cable monitoring and linked diagnostic features including cable length measurements, detached shorts and opens and SNR monitor. The housing in an embodiment may be a die-cast housing. The housing may include a bale latch style ejector mechanism. The module may include unshielded and shielded cable support.

Attached to the transceiver module housing 100 is the peripheral connector 200. The peripheral connector 200 includes a first end 201 and a second end 202. Receptacle openings 210 are provided at the second end 202 of the peripheral connector 200. In an embodiment, the receptacle opening includes a dual port having first opening 210a and second opening 210b. In an embodiment the openings 210a, b provide for an RJ-45 type connection for copper applications. In an alternative embodiment the receptacle opening may provide for fiber optic connectivity such as via an MPO style connector or LC type connectors.

The peripheral connector 200 links via flex circuit 300 to the transceiver module housing 100. The flex circuit 300 may include a flex circuit cover 310 and is received at the first end 101 of the transceiver module housing 100 through passage 110. Fig. 1 depicts the X, Y and Z axis. The Y axis forms a center-line extending laterally through the length of the transceiver housing 100, along the flex circuit 300 and through the peripheral connector 200 (see also Figs. 2 and 3). The X axis extends perpendicular to the Y axis. The Z axis extends up and down with respect to Fig. 1 and is perpendicular to the Y axis and forms YZ plane. As described below, the flex circuit 300 allows for movement of the peripheral connector in the YZ-plane and movement of the peripheral connector 200 is prevented along the X-axis and Y-axis. The flex circuit 300 may be disposed laterally in the YZ-plane as depicted in Figs 2 and 3 and also torsional or rotational twisting of the flex circuit 300 is facilitated in the YZ plane.

Turning to Fig. 2 the transceiver module assembly will be described with respect to the different orientations available for the peripheral connector 200. The transceiver module housing 100 is depicted having a center line Y1 extending from the first end 101 to the second end 102. The flex circuit 300 is shown in a flexed orientation where the peripheral connector 200a has been moved laterally in an upward direction so that the peripheral connector is perpendicular to the center line Y1. The receptacle opening 210 is parallel to the center line Y1. Likewise the pull tab 112 is oriented in a position that is perpendicular to the center line Y1.

Turning to Fig. 3, the peripheral connector 200b is oriented in a downward direction. The connector 200b may be flexed downward in a direction opposite to the position shown for the peripheral connector 200a, shown in Fig. 2. In particular, the peripheral connector 200b has been moved laterally downward, so that it is perpendicular to the center line Y1 of the transceiver module housing of Fig. 3. In such an orientation the receptacle opening 210 of the peripheral connector 200b is parallel to the center line Y1 and connection of a cable may be obtained by inserting the cable in the receptacle opening 210 in a direction perpendicular to the center line Y1. In Fig. 3 the pull tab 112 has not been displaced and is parallel to the center line Y1 in its original orientation. The pull tab need not be reoriented with respect to the lateral orientation of the peripheral connector 200b because it is located along the top portion of the transceiver module housing 100 and does not interfere with the movement of the peripheral connector 200b (which is not the case with respect to Fig. 2 when the peripheral connector 200a is moved upward).

With respect to Fig. 2 and Fig. 3 used in an example where the transceiver module housings are inserted into a server or computer device on a rack (not shown), it can be understood that the lateral movement of the peripheral connectors 200a,b allow for ease of connection of cables in a tightly spaced rack due to the lateral disorientation of the peripheral connections 200a,b.

Turning to Figs. 4-6 the transceiver module housing 100 is shown where the second end 102 is depicted in Fig. 5 in an end view. Viewing the transceiver module housing 100 from the end, the edge connector 130 is depicted within an opening at the second end 102. Fig. 6 depicts an end view of the second end 202 of the peripheral connector. The receptacle openings 210a,b are shown in Fig. 6 and depict the RJ-45 type connectors having contacts 218 disposed therein. Therefore it is understood that the transceiver module housing may be inserted into a cage of a host device (not shown) and the edge connector 130 received by a connector within the cage of the host. At the opposite end a cable may be inserted in the second end 202 of the peripheral connector 200 in order that signals may be transmitted from the peripheral connector through the flex circuit 300 via the printed circuit board 120 and to the host device via the edge connector 130. And vice versa, signals from the host device can be transmitted backwards out towards the peripheral connector 200 and via cables (not shown) attached to the receptacle openings 210 of the peripheral connector 200.

Turning to Fig. 7 the flex circuit will be described in more detail. The flex circuit 300 is positioned between the transceiver module housing 100 and the peripheral connector 200. In an embodiment the transceiver module 100 includes a zero insertion force (ZIF) connecter 156 to receive a conductor extending from the flex circuit 300. Likewise the peripheral connector 200 includes a zero insertion force connector 206 which receives a conductor extending in the opposite direction from the flex circuit 300. Fig. 8 depicts an exploded view of the portion A of the flex circuit 300. The flex circuit includes a lower cover 310 and upper cover 317, a spacer 311, a flex circuit 318 and foil wrap 319 that surrounds the flex circuit in the spacer.

Fig. 7 is a section view of Fig. 4 taken along a center line. The nylon strain relief 317 includes a finger at each end 321, 322 that are received in channels of each of the housings of the transceiver module 100 and peripheral connector 200. The assembly of the transceiver module assembly and the flex circuit may be understood with respect to Fig. 7 and 8. The flex circuit 300 is assembled having the foil 319 wrapped around the flex circuit 318. Conductors 324, 325 extend at each end of the flex circuit. The lower cover 310 is attached to the bottom of the flex circuit having foil wrap 319. The foil wrap 319 electrically connects the transceiver housing 100 to the peripheral connector 200 in order to providing grounding between the peripheral connector 200 and the transceiver housing 100. The nylon strain relief 317 is then attached to complete the flex circuit assembly 310. The conductor 324 is received in the zero insertion force connector 206 of the peripheral connector 200 by inserting the conductor 324 therein. The finger 321 is received on the housing of the peripheral connector 200. The upper housing 214 is then placed over the finger 321 to secure it within the channel of the upper housing 214. The conductor 325 is then inserted into zero insertion force connector 156 of the transceiver module housing 100. The upper housing 140 is then placed onto the lower housing 142 and the finger 322 is received in the channel of the upper housing 140. Thus by use of the zero insertion force connectors 156, 206 and the nylon strain relief 317 having fingers 321, 322; the quick and easy assembly of the flex circuit 300 between the transceiver module housing 100 and peripheral connector 200 can be accomplished.

Turning to Fig. 9, further details of the invention will be described. The lower body 142 receives a printed circuit board 120 and springs 154 are inserted on the lower body 142 in order to operate the latching mechanism 160. The ZIF connector 156 is then placed adjacent the printed circuit board 120 and the first end 101 of the lower body 142. The frame 145 is mounted between the upper and lower bodies 140, 142, so that the frame 145 may reciprocate laterally (forward and backward) with respect to the lower body 142. The forward movement of the frame member 145 allows the transceiver housing 100 to unlock from a cage/ host device (not shown). The upper and lower bodies 140, 142, capture the printed circuit board 120 therebetween. Prior to placement of the upper body 140 onto the lower body housing 142, the flex circuit 300 is assembled.

Assembly of the flex circuit occurs by assembling the cover 310 with the spacer 311, the flex circuit 318 and the foil cover 319. The strain relief 317 is placed on top of the foil wrapped subassembly and the cover 319 is disposed below. The spacer 311 is wrapped by the foil with the flex circuit 318. The finger 322 of the strain relief 317 is received by the upper body 140 of the housing and is clamped in a channel to mount the flex circuit to the housing. As well, the end 325 of the flex circuit 318 is inserted into the ZIF connector 156.

Assembly of the flex circuit is also part of the assembly steps of the peripheral connector 200. The peripheral connector is assembled by placing RJ-45 body 216 into the extension front housing 213. Grounding strips 231, 232 extend into the openings 210a, b of the extension front housing 213. The extension rear bottom housing 215 has an extension printed circuit board 217 placed therein and ZIF connector 206 mounted on top of the extension PCB 217. The extension rear top housing 214 is then placed onto the extension bottom housing 215 to capture the printed circuit board 217 and ZIF connector 216 therein. These assemblies are held together by fasteners 235.

As discussed above with respect to the attachment of the flex connector to the transceiver housing 100, likewise the second end 324 of the flex circuit 318 is received by the ZIF connector 206 of the peripheral connector 200 and the finger 321 of the strain relief 317 is received within a channel of the extension rear top housing 214 to mechanically engage the strain relief 317 therein.

Turning to Fig. 10, four transceiver housings 100a,b,c,d are depicted mounted in close proximity to one another, each of the housings 100a,b,c,d having a peripheral connector 200a,b,c,d (respectively) being attached by flex circuits 300a,b,c,d (respectively). In a situation where the transceiver housings 100a,b,c,d are mounted within a receptacle of a host device and the flex circuits 300a,b,c,d extend through a bezel or opening in the front of the host device, the peripheral connectors 200a,b,c,d can be oriented in varying orientations to allow for easier access to the peripheral connector 200a,b,c,d in tightly spaced racks, so that cables may be plugged to the peripheral connector more easily. The flexible nature of the flex circuits 300a,b,c,d allows for an operator to adjust the orientation of the peripheral connectors 200a,b,c,d in a lateral direction, so that a cable (or pair of cables)(not shown) may be inserted into each peripheral connector 200a,b,c,d.

Figs. 11a-c are circuit diagrams of an embodiment of the present invention. Fig. 11a depicts the circuitry of a first peripheral connector 200a that provides electrical connections between an RJ-45 connector having eighteen signal lines to connect to the transceiver 100. For example, the circuitry Fig. 11a could be carried by PCB 217 including a PHY Layer IC. Fig. 11b depicts a second peripheral connector 200b having electronic connections to transmit and receive signals between an RJ-45 connector and a transceiver housing 100. It is understood that if there are additional peripheral connectors, such as shown in Fig. 10, each peripheral connector may have circuitry as discussed above. Fig. 11c depicts the electronic circuitry of the transceiver and may be carried by PCB 120. In an embodiment, the transceiver is compliant with the QSFP+ specification and the circuitry in Fig. 11c will comply with SFF 8436 including circuitry to control and FPGA and a SERIAL ID chip. Thirty eight signal pins depicted in Fig. 11c are located to form edge connector 130.

Turning to Figs. 12-15, an alternate embodiment of the invention will be described. The peripheral connector 400 is pivotally attached to the transceiver housing 410 via pivot extension 412 that is pivotally attached to pivot arm 420, for example by a rivet 429. The pivot extension 412 and pivot arm 420 provide lateral stability to the assembly and prevent the flex circuit 416 from transverse movement in the Y-axis or from twisting about the Y axis (Fig. 2) within the YZ-plane (see Fig. 1). In other words, as shown in Fig. 2 the transceiver housing 200a may be displaced upward (away from the axis Y1), but cannot be displaced to left or right (or into the page or out of the page as depicted in Fig. 2). With respect to Fig. 3, the transceiver housing 200b is displaced downward (away from axis Y1), but cannot be displaced left or rights (or into the page or out of the page as depicted in Fig. 3). A flap 430 is pivotally attached at pivot point 431 to the end of the transceiver housing 410. An anti-deflection member, such as a leg 432 is disposed on the transceiver housing 410. In an embodiment, the flap 430 includes the anti-deflection member and is disposed opposite the pivot point 431 on the flap 430. In an alternate embodiment, the anti-deflection member may be disposed on the peripheral connector 400.

The leg 432 of the flap 430 engages a gap 435 provided by the pivot extension 412 in order to prevent the flex circuit 416 from deflecting upward (in a direction opposite the offset peripheral connector 400, as shown in Fig. 15). The leg 432 may have a predetermined length in order to set the angle of allowed deflection of the connector 400. As shown in Fig. 14, the leg 432 has a length of 0.74 cm and maintains the flex circuit 416 and the connector 400 in-line with the transceiver housing 410. In other words, the leg 432 allows for 0 degree of upward deflection of the flex circuit 416 and connector 400.

In an alternate embodiment, the leg may have half the length of the leg 432 depicted in Fig. 14 (for example a length of 0.37cm), that will allow twenty eight degrees of upward deflection of the flex circuit 416 and connector 400. So it may be understood that an adjustable anti-deflection member 430/432 is provided by the present invention by altering the length of the leg 432 provided by the flap 430. Any range of deflection between zero to one hundred and twenty degrees may be facilitated by the anti-deflection member 432.

Fig. 15 depicts a deflection control member 441 that controls the angle of deflection of the flex circuit 416 and connector 400 (45 degrees). In an embodiment, the deflection control member 441 includes a triangular shaped detente 441 that engages an edge 443 of the pivot arm 420. In an embodiment the deflection control member is disposed on the peripheral connector 400. In an alternate embodiment, the deflection control member may be disposed on the transceiver housing 410. The invention provides for the détente 441 to engage an edge 443, each provided on either the pivot arm 420 or pivot extension 412 in order to engage one another when the flex circuit 416 is deflected in order to limit the angle of deflection of the peripheral connector 400 with respect to the transceiver housing 410. Any range of deflection between zero to one hundred and twenty degrees may be facilitated by the deflection control member 441

As depicted in Figs 16 and 17, the détentes 441a,b are depicted extending from the sides of the pivot extensions 412. In an embodiment, the détente 441 may have a generally triangular shape in cross-section and a hypotenuse 451. The hypotenuse side may have a predetermined angle with respect to the triangular détente 441 in order to control the deflection provided by the flex circuit assembly. For example, as the hypotenuse 451 is formed at steeper angle, it will engage the edge 443a,b of the pivot arm 420 sooner and restrict the deflection of the flex circuit assembly and peripheral connector 400 with respect to the transceiver housing 410. In an embodiment, where the hypotenuse 451 is shallow, the détente 441a,b will engage the edge 443a,b later and the flex circuit assembly and peripheral connector 400 will be allowed to deflect further with respect to the transceiver housing 410. In an alternate embodiment, the détente 441 may have other rectilinear, triangular or trapezoidal shapes in cross-section and interact with the edge 443 of the pivot arm 420 to control the angle of deflection of the flex circuit assembly. In an embodiment, during manufacture, by positioning the détente distally or proximally along the pivot extension 412, the angle of deflection of the flex circuit may be controlled. It is also understood that the détente 441a,b may be located on the pivot arm 420 and engage an edge of the pivot extension 412 and also include all the variations discussed above.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.--.

(12) United States Patent
Skepnek et al.

(10) Patent No.: US 10,367,286 B2
(45) Date of Patent: *Jul. 30, 2019

(54) TRANSCEIVER MODULE WITH FLEX CIRCUIT

(71) Applicant: Methode Electronics, Inc., Chicago, IL (US)

(72) Inventors: Robert Skepnek, Chicago, IL (US); Joseph Llorens, Winfield, IL (US); Alexandros Pirillis, Chicago, IL (US)

(73) Assignee: Methode Electronics, Inc., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/859,906

(22) Filed: Jan. 2, 2018

(65) Prior Publication Data

US 2018/0205166 A1    Jul. 19, 2018

Related U.S. Application Data

(63) Continuation of application No. 15/406,920, filed on Jan. 16, 2017, now Pat. No. 9,972,930.

(51) Int. Cl.
| | |
|---|---|
| *H01R 12/81* | (2011.01) |
| *H01R 12/77* | (2011.01) |
| *H01R 12/82* | (2011.01) |
| *G06F 1/16* | (2006.01) |
| *H01R 12/62* | (2011.01) |
| *H01R 35/02* | (2006.01) |
| *H05K 1/02* | (2006.01) |
| *H05K 1/14* | (2006.01) |
| *G02B 6/42* | (2006.01) |

(52) U.S. Cl.
CPC .......... *H01R 12/81* (2013.01); *G06F 1/1632* (2013.01); *H01R 12/62* (2013.01); *H01R 12/772* (2013.01); *H01R 12/82* (2013.01); *H01R 35/02* (2013.01); *H05K 1/028* (2013.01); *H05K 1/147* (2013.01); *G02B 6/4281* (2013.01); *H05K 2201/046* (2013.01); *H05K 2201/2018* (2013.01)

(58) Field of Classification Search
CPC ...... H01R 12/81; H01R 12/772; H01R 12/82; H01R 35/02
USPC ............................................................ 439/1
See application file for complete search history.

(56) References Cited

U.S. PATENT DOCUMENTS

| | | | | |
|---|---|---|---|---|
| 4,226,491 A * | 10/1980 | Kazama | ............. | H05K 1/02 361/759 |
| 5,507,654 A * | 4/1996 | Daly | ............. | H01R 12/57 439/76.1 |
| 5,636,998 A * | 6/1997 | Daly | ............. | H01R 13/6658 439/498 |
| 6,179,627 B1 * | 1/2001 | Daly | ............. | H01R 13/6658 439/354 |
| 6,315,207 B1 * | 11/2001 | Eisele | ............. | G06F 3/0607 235/481 |

(Continued)

*Primary Examiner* — Alexander Gilman
(74) *Attorney, Agent, or Firm* — Gould & Ratner LLP

(57) ABSTRACT

A pluggable module comprising a housing having a first end and second end, an edge connector disposed at the first end, an F-type coaxial connector at the second end and a release lever including a stamped body that is symmetrical about a centerline bisecting the length of the body. The pluggable module comprises a miniature balun disposed within the module for converting between a single-ended input to a differential load.

26 Claims, 13 Drawing Sheets